(12) United States Patent
Yoshida et al.

(10) Patent No.: US 11,338,609 B2
(45) Date of Patent: May 24, 2022

(54) DECORATIVE FILM FORMED BODY, MANUFACTURING METHOD FOR A DECORATIVE FILM FORMED BODY, MOUNTING METHOD FOR A TRANSFER BASE MATERIAL, SATIN-PLATED PREPARATION, CONTAINER, CASING, AND VEHICLE INTERIOR/EXTERIOR MEMBER

(71) Applicant: OIKE & CO., LTD., Kyoto (JP)

(72) Inventors: Atsushi Yoshida, Kyoto (JP); Norio Hakiri, Kyoto (JP); Tatsuya Mitsushio, Kyoto (JP); Kohei Kizaki, Kyoto (JP)

(73) Assignee: OIKE & CO., LTD., Kyoto (JP)

( * ) Notice: Subject to any disclaimer, the term of this patent is extended or adjusted under 35 U.S.C. 154(b) by 198 days.

(21) Appl. No.: 16/697,383

(22) Filed: Nov. 27, 2019

(65) Prior Publication Data
US 2020/0207145 A1    Jul. 2, 2020

(30) Foreign Application Priority Data

Dec. 27, 2018   (JP) .............................. JP2018-245557
Dec. 27, 2018   (JP) .............................. JP2018-245558
(Continued)

(51) Int. Cl.
*B32B 3/02*    (2006.01)
*B44C 1/17*    (2006.01)
(Continued)

(52) U.S. Cl.
CPC .............. *B44C 1/1704* (2013.01); *B05D 1/40* (2013.01); *B05D 5/10* (2013.01); *B32B 3/263* (2013.01); *C23C 16/06* (2013.01)

(58) Field of Classification Search
CPC .............................. B32B 3/263; B44C 1/1704
See application file for complete search history.

(56) References Cited

U.S. PATENT DOCUMENTS

| 6,088,947 A | 7/2000 | Suzue et al. |
| 2020/0171801 A1* | 6/2020 | Kaneuchi .................. B32B 7/06 |

FOREIGN PATENT DOCUMENTS

| CN | 207274255 | 4/2018 |
| CN | 108891182 | 11/2018 |

(Continued)

OTHER PUBLICATIONS

Extended European Search Report issued in EP 19219081.7, dated May 25, 2020.

*Primary Examiner* — Elizabeth E Mulvaney
(74) *Attorney, Agent, or Firm* — Leason Ellis LLP

(57) ABSTRACT

Provided is a decorative film formed body being capable of exhibiting excellent metallic design presentation of satin plating with less color blur through decoration with use of a vapor deposition film, a manufacturing method for a decorative film formed body, a mounting method for a transfer base material, a satin-plated preparation, a container, a casing, and a vehicle interior/exterior member. The decorative film formed body includes: a base material; an adhesive layer; a vapor deposition layer; and a protection layer, wherein the vapor deposition layer has recesses and projections formed on a surface thereof, and wherein the adhesive layer includes scale-shaped fillers.

4 Claims, 7 Drawing Sheets

(30) Foreign Application Priority Data

Dec. 27, 2018 (JP) .............................. JP2018-245559
Dec. 27, 2018 (JP) .............................. JP2018-245560

(51) Int. Cl.
*B05D 1/40* (2006.01)
*B05D 5/10* (2006.01)
*C23C 16/06* (2006.01)
*B32B 3/26* (2006.01)

(56) References Cited

FOREIGN PATENT DOCUMENTS

| | | |
|---|---|---|
| JP | 3146553 | 3/2001 |
| JP | 2016-160488 | 9/2016 |
| JP | 2017065167 | 4/2017 |
| JP | 6198112 | 9/2017 |
| JP | 2018084613 | 5/2018 |
| JP | 2018130859 | 8/2018 |

* cited by examiner

DECORATIVE FILM FORMED BODY, MANUFACTURING METHOD FOR A DECORATIVE FILM FORMED BODY, MOUNTING METHOD FOR A TRANSFER BASE MATERIAL, SATIN-PLATED PREPARATION, CONTAINER, CASING, AND VEHICLE INTERIOR/EXTERIOR MEMBER

CROSS-REFERENCE TO PRIOR APPLICATION

This application claims priority to and the benefit thereof from Japanese Patent Applications, Nos. JP2018-245557, filed Dec. 27, 2018, JP2018-245558, filed Dec. 27, 2018, JP2018-245559, filed Dec. 27, 2018, and JP2018-245560, filed Dec. 27, 2018 titled "DECORATIVE FILM FORMED BODY, MANUFACTURING METHOD FOR A DECORATIVE FILM FORMED BODY, MOUNTING METHOD FOR A TRANSFER BASE MATERIAL, SATIN-PLATED PREPARATION, CONTAINER, CASING, AND VEHICLE INTERIOR/EXTERIOR MEMBER," the entireties of which are hereby incorporated herein by reference.

TECHNICAL FIELD

The present invention relates to a decorative film formed body, a manufacturing method for a decorative film formed body, a mounting method for a transfer base material, a satin-plated preparation, a container, a casing, and a vehicle interior/exterior member. More specifically, the present invention relates to a decorative formed body being a decorative formed product decorated with a vapor deposition film and being capable of exhibiting excellent metallic design presentation of satin plating with less color blur, a manufacturing method for such a decorative film formed body, a mounting method for a transfer base material, a satin-plated preparation using such a decorative film formed body, a container, a casing, and a vehicle interior/exterior member.

BACKGROUND OF THE INVENTION

Hitherto, for example, in a field of automobile interior/exterior components, in order to exhibit luxurious presentation, metallic designs such as chromium plating and satin plating are adopted. The satin plating is a way of finishing a product into a matte state by applying nickel plating and thereafter performing buff polishing with use of a satiner abrasive. The satin plating exhibits a settled texture and is often used for interior components and emblems for vehicles.

However, related-art satin plating involves complicated processes and has significant color blur. Therefore, there has been proposed surface treatment other than plating, such as a metal appearance finishing method. For example, there has been an attempt to reproduce the same surface texture as the surface texture of satin plating by a method other than plating. Moreover, in Japanese Patent Application Publication No. 2016-160488, there is disclosed a method of performing satin-nickel plating with use of a plating bath containing a specified amine compound and a specified siloxane compound. Besides, in a technical field of film decoration, there has been an attempt to reproduce metallic design presentation of satin plating with use of a matte resin layer.

SUMMARY OF THE INVENTION

However, when surface treatment other than the related-art plating is used, or when an attempt is made to reproduce a satin plating pattern with use of a related-art decorative film, metallic design presentation similar to that of the satin plating cannot be sufficiently expressed yet.

The present invention has been made in view of such related-art invention, and has an object to provide a decorative film formed body being capable of exhibiting excellent metallic design presentation of satin plating with less color blur through decoration with use of a vapor deposition film, a manufacturing method for a decorative film formed body, a mounting method for a transfer base material, a satin-plated preparation, a container, a casing, and a vehicle interior/exterior member.

As a result of extensive studies, the inventors of the present invention have found that the metallic design presentation of satin plating with less color blur can more accurately be reproduced in the following manner. In order to obtain characteristic dull metallic gloss of the satin plating pattern, in a film including an adhesive layer and a vapor deposition layer, the vapor deposition layer has recesses and projections formed on a surface thereof, and the adhesive layer includes scale-shaped fillers. Based on the findings described above, the inventors have completed the present invention (first invention). That is, a decorative film formed body, a manufacturing method for a decorative film formed body, a mounting method for a transfer base material, a satin-plated preparation, a container, a casing, and a vehicle interior/exterior member according to the present invention (first invention) for solving the problem described above mainly have the following configuration.

<First Invention>

(1) A decorative film formed body, comprising: a base material; an adhesive layer; a vapor deposition layer; and a protection layer, wherein the vapor deposition layer has recesses and projections formed on a surface thereof, and wherein the adhesive layer includes scale-shaped fillers.

(2) The decorative film formed body according to (1), wherein the recesses and projections include projecting portions projecting toward the protection layer side.

(3) The decorative film formed body according to (1) or (2), wherein the protection layer has recesses and projections formed on a surface thereof on a side opposite to a surface on which the vapor deposition layer is provided.

(4) The decorative film formed body according to any one of (1) to (3), wherein the scale-shaped fillers are embedded in the adhesive layer, and the recesses and projections of the vapor deposition layer comprise recesses and projections deformed along a shape of the embedded scale-shaped fillers.

(5) A manufacturing method for a decorative film formed body, comprising: a release layer forming step of forming a release layer on a separation base material; a protection layer forming step of forming a protection layer on the release layer; a vapor deposition layer forming step of forming a vapor deposition layer on the protection layer; an adhesive layer forming step of forming an adhesive layer on the vapor deposition layer; a transfer base material forming step of forming a transfer base material on the adhesive layer; and a separating step of separating the separation base material and the release layer, wherein the adhesive layer includes scale-shaped fillers, and wherein the transfer base material forming step includes a recesses/projections forming step of forming recesses and projections on a surface of the vapor deposition layer by embedding the scale-shaped fillers in the adhesive layer.

(6) A mounting method for a transfer base material in a decorative film formed body, comprising: a release layer forming step of forming a release layer on a separation base material; a protection layer forming step of forming a protection layer on the release layer; a vapor deposition layer forming step of forming a vapor deposition layer on the protection layer; an adhesive layer forming step of forming an adhesive layer on the vapor deposition layer; a transfer base material forming step of forming a transfer base material on the adhesive layer; and a separating step of separating the separation base material and the release layer, wherein the adhesive layer includes scale-shaped fillers, and wherein the transfer base material forming step includes a recesses/projections forming step of forming recesses and projections on a surface of the vapor deposition layer by embedding the scale-shaped fillers in the adhesive layer.

(7) A satin-plated preparation using the decorative film formed body of any one of (1) to (4).

(8) A container using the decorative film formed body of any one of (1) to (4).

(9) A casing using the decorative film formed body of any one of (1) to (4).

(10) A vehicle interior/exterior member using the decorative film formed body of any one of (1) to (4).

Moreover, as a result of extensive studies, the inventors of the present invention have found that the metallic design presentation of satin plating with less color blur can more accurately be reproduced in the following manner. In order to obtain characteristic dull metallic gloss of the satin plating pattern, in a film including a protection layer and a vapor deposition layer, the vapor deposition layer has recesses and projections formed on a surface thereof, and the protection layer includes lens-shaped fillers. Based on the findings described above, the inventors have completed the present invention (second invention). That is, a decorative film formed body, a manufacturing method for a decorative film formed body, a mounting method for a transfer base material, a satin-plated preparation, a container, a casing, and a vehicle interior/exterior member according to the present invention (second invention) for solving the problem described above mainly have the following configuration.

<Second Invention>

(1) A decorative film formed body, comprising: a base material; an adhesive layer; a vapor deposition layer; and a protection layer, wherein the vapor deposition layer has recesses and projections formed on a surface thereof, wherein the recesses and projections include projecting portions projecting toward the adhesive layer side, and wherein the protection layer includes lens-shaped fillers.

(2) The decorative film formed body according to (1), wherein the projecting portions each have a maximum diameter of from 2.0 µm to 20 µm.

(3) The decorative film formed body according to (1) or (2), wherein the lens-shaped fillers are embedded in the protection layer, and wherein the recesses and projections of the vapor deposition layer comprise recesses and projections deformed along a shape of the embedded lens-shaped fillers.

(4) A manufacturing method for a decorative film formed body, comprising: a release layer forming step of forming a release layer on a separation base material; a protection layer forming step of forming a protection layer on the release layer; a vapor deposition layer forming step of forming a vapor deposition layer on the protection layer; an adhesive layer forming step of forming an adhesive layer on the vapor deposition layer; a transfer base material forming step of forming a transfer base material on the adhesive layer; and a separating step of separating the separation base material and the release layer, wherein the protection layer includes lens-shaped fillers, wherein the protection layer forming step includes a step of exposing the lens-shaped fillers from a surface of the protection layer, and wherein the vapor deposition layer forming step includes a recesses/projections forming step of forming recesses and projections on a surface of the vapor deposition layer by forming the vapor deposition layer so as to cover the exposed lens-shaped fillers.

(5) A satin-plated preparation using the decorative film formed body of any one of (1) to (3).

(6) A container using the decorative film formed body of any one of (1) to (3).

(7) A casing using the decorative film formed body of any one of (1) to (3).

(8) A vehicle interior/exterior member using the decorative film formed body of any one of (1) to (3).

Moreover, as a result of extensive studies, the inventors of the present invention have found that the metallic design presentation of satin plating with less color blur can more accurately be reproduced in the following manner. In order to obtain characteristic dull metallic gloss of the satin plating pattern, in a film including an adhesive layer and a vapor deposition layer, the vapor deposition layer has recesses and projections formed on a surface thereof, and the adhesive layer includes lens-shaped fillers. Based on the findings described above, the inventors have completed the present invention (third invention). That is, a decorative film formed body, a manufacturing method for a decorative film formed body, a mounting method for a transfer base material, a satin-plated preparation, a container, a casing, and a vehicle interior/exterior member according to the present invention (third invention) for solving the problem described above mainly have the following configuration.

<Third Invention>

(1) A decorative film formed body, comprising: a base material; an adhesive layer; a vapor deposition layer; and a protection layer, wherein the vapor deposition layer has recesses and projections formed on a surface thereof, and wherein the adhesive layer includes lens-shaped fillers.

(2) The decorative film formed body according to (1), wherein the recesses and projections include projecting portions projecting toward the protection layer side.

(3) The decorative film formed body according to (1) or (2), wherein the protection layer has recesses and projections formed on a surface thereof on a side opposite to a surface on which the vapor deposition layer is provided.

(4) The decorative film formed body according to any one of (1) to (3), wherein the lens-shaped fillers are embedded in the adhesive layer, and wherein the recesses and projections of the vapor deposition layer comprise recesses and projections deformed along a shape of the embedded lens-shaped fillers.

(5) A manufacturing method for a decorative film formed body, comprising: a release layer forming step of forming a release layer on a separation base material; a protection layer forming step of forming a protection layer on the release layer; a vapor deposition layer forming step of forming a vapor deposition layer on the protection layer; an adhesive layer forming step of forming an adhesive layer on the vapor deposition layer; a transfer base material forming step of forming a transfer base material on the adhesive layer; and a separating step of separating the separation base material and the release layer, wherein the adhesive layer includes lens-shaped fillers, and wherein the transfer base material forming step includes a recesses/projections forming step of forming recesses and projections on a surface of the vapor deposition layer by embedding the lens-shaped fillers in the adhesive layer.

(6) A mounting method for a transfer base material in a decorative film formed body, comprising: a release layer forming step of forming a release layer on a separation base material; a protection layer forming step of forming a protection layer on the release layer; a vapor deposition layer forming step of forming a vapor deposition layer on the protection layer; an adhesive layer forming step of forming an adhesive layer on the vapor deposition layer; a transfer base material forming step of forming a transfer base material on the adhesive layer; and a separating step of separating the separation base material and the release layer, wherein the adhesive layer includes lens-shaped fillers, and wherein the transfer base material forming step includes a recesses/projections forming step of forming recesses and projections on a surface of the vapor deposition film by embedding the lens-shaped fillers in the adhesive layer.

(7) A satin-plated preparation using the decorative film formed body of any one of (1) to (4).

(8) A container using the decorative film formed body of any one of (1) to (4).

(9) A casing using the decorative film formed body of any one of (1) to (4).

(10) A vehicle interior/exterior member using the decorative film formed body of any one of (1) to (4).

In addition, as a result of extensive studies, the inventors of the present invention have found that the metallic design presentation of sating plating with less color blur can more accurately be reproduced in the following manner. In order to obtain characteristic dull metallic gloss of the satin plating pattern, in a film including a protection layer and a vapor deposition layer, the vapor deposition layer has predetermined recesses and projections formed on a surface thereof, and the protection layer includes scale-shaped fillers. Based on the findings described above, the inventors have completed the present invention (fourth invention). That is, a decorative film formed body, a manufacturing method for a decorative film formed body, a mounting method for a transfer base material, a satin-plated preparation, a container, a casing, and a vehicle interior/exterior member according to the present invention (fourth invention) for solving the problem described above mainly have the following configuration.

<Fourth Invention>

(1) A decorative film formed body, comprising: a base material; an adhesive layer; a vapor deposition layer; and a protection layer, wherein the vapor deposition layer has recesses and projections formed on a surface thereof, wherein the recesses and projections include projecting portions projecting toward the adhesive layer side, and wherein the protection layer includes scale-shaped fillers.

(2) The decorative film formed body according to (1), wherein the projecting portions each have a maximum diameter of from 2.0 μm to 20 μm.

(3) The decorative film formed body according to (1) or (2), wherein the scale-shaped fillers are embedded in the protection layer, and wherein the recesses and projections of the vapor deposition layer comprise recesses and projections deformed along a shape of the embedded scale-shaped fillers.

(4) A manufacturing method for a decorative film formed body, comprising: a release layer forming step of forming a release layer on a separation base material; a protection layer forming step of forming a protection layer on the release layer; a vapor deposition layer forming step of forming a vapor deposition layer on the protection layer; an adhesive layer forming step of forming an adhesive layer on the vapor deposition layer; a transfer base material forming step of forming a transfer base material on the adhesive layer; and a separating step of separating the separation base material and the release layer, wherein the protection layer includes scale-shaped fillers, wherein the protection layer forming step includes a step of exposing the scale-shaped fillers from a surface of the protection layer, and wherein the vapor deposition layer forming step includes a recesses/projections forming step of forming recesses and projections on a surface of the vapor deposition layer by forming the vapor deposition layer so as to cover the exposed lens-shaped fillers.

(5) A satin-plated preparation using the decorative film formed body of any one of (1) to (3).

(6) A container using the decorative film formed body of any one of (1) to (3).

(7) A casing using the decorative film formed body of any one of (1) to (3).

(8) A vehicle interior/exterior member using the decorative film formed body of any one of (1) to (3).

According to the present invention (first invention), a decorative film formed body being capable of exhibiting excellent metallic design presentation of satin plating with less color blur through decoration with use of a vapor deposition film, a manufacturing method for a decorative film formed body, a mounting method for a transfer base material, a satin-plated preparation, a container, a casing, and a vehicle interior/exterior member can be provided. Further, according to the present invention (second invention), a decorative film formed body being capable of exhibiting excellent metallic design presentation of satin plating with less color blur through decoration with use of a vapor deposition film, a manufacturing method for a decorative film formed body, a satin-plated preparation, a container, a casing, and a vehicle interior/exterior member can be provided. Further, according to the present invention (third invention), a decorative film formed body being capable of exhibiting excellent metallic design presentation of satin plating with less color blur through decoration with use of a vapor deposition film, a manufacturing method for a decorative film formed body, a mounting method for a transfer base material, a satin-plated preparation, a container, a casing, and a vehicle interior/exterior member can be provided. In addition, according to the present invention (fourth invention), a decorative film formed body being capable of exhibiting excellent metallic design presentation of satin plating with less color blur through decoration with use of a vapor deposition film, a manufacturing method for a decorative film formed body, a satin-plated preparation, a container, a casing, and a vehicle interior/exterior member can be provided.

DETAILED DESCRIPTION

<Decorative Film Formed Body>

Figure 1:
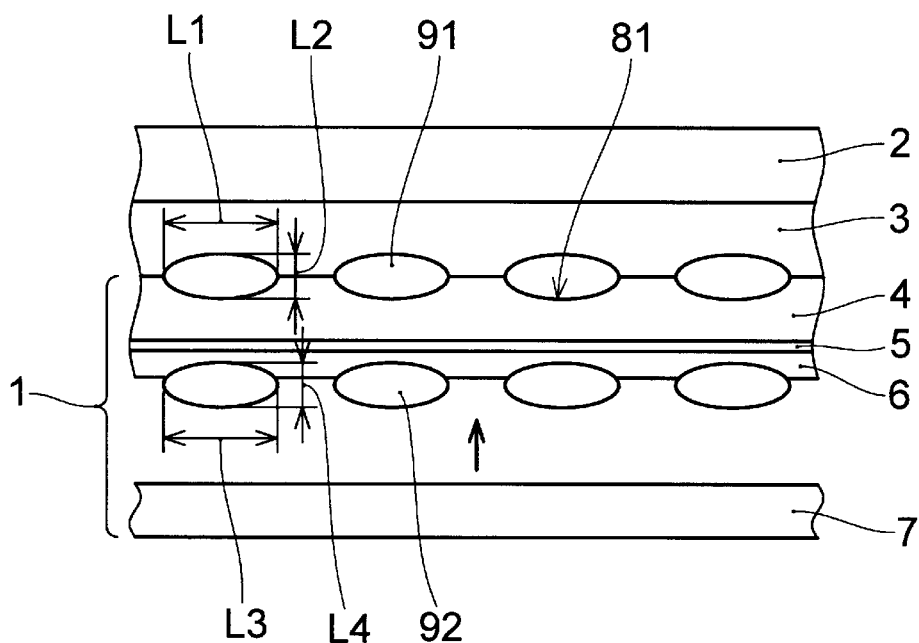
FIG. 1 is a schematic sectional view for illustrating a manufacturing method for a decorative film formed body according to one embodiment (first embodiment) of the present invention.

A decorative film formed body according to one embodiment of the present invention includes a base material, an adhesive layer, a vapor deposition layer, and a protection layer. The vapor deposition layer has recesses and projections formed on a surface thereof. The adhesive layer includes scale-shaped fillers (only in the case of the first invention) or lens-shaped fillers (only in the case of the third invention). The recesses and projections include projecting portions projecting toward the adhesive layer side, and the protection layer includes lens-shaped fillers (only in the case of the second invention). The recesses and projections include projecting portions projecting toward the adhesive layer side, and the protection layer includes scale-shaped fillers (only in the case of the fourth invention). It is preferred that the decorative film formed body have a distinctness of image of from 10 to 92, and that a ratio (GS60°/L*45) of a specular glossiness (GS60°) given when an incident angle is 60° to an L* value (L*45) given when an incident angle and an acceptance angle are 45° be from 5 to 55. That is, the decorative formed body according to the present embodiment is a vapor deposition film including a vapor deposition layer, and it is preferred that the distinctness of image and the ratio (GS60°/L*45) be adjusted so as to fall within the ranges described above. The decorative film formed body accurately reproduces metallic design presentation of satin plating with less color blur.

(Base Material)

The base material (transfer base material) is not particularly limited. Examples of the base material include a resin sheet, paper, fabric, a rubber sheet, and a foam sheet. Examples of the resin sheet include: a polyolefin-based resin sheet made of polyethylene (PE), polypropylene (PP), or an ethylene-propylene copolymer; a polyester-based resin sheet made of polyethylene terephthalate (PET), polybutylene terephthalate (PBT), or polyethylene naphthalate (PEN); a vinyl chloride resin sheet; a vinyl acetate resin sheet; a polyimide resin sheet; a polyamide resin sheet; a fluorocarbon resin sheet; and cellophane. Examples of the paper include Japanese paper, kraft paper, glassine paper, wood-free paper, synthetic paper, and topcoat paper. Examples of the fabric include woven fabric and nonwoven fabric formed through spinning of a single fibrous material or various fibrous materials. Examples of the rubber sheet include a natural rubber sheet and a butyl rubber sheet. Examples of the foam sheet include a foamed PE sheet, a foamed polyolefin sheet, a foamed polyester sheet, a foamed polyurethane sheet, and a foamed polychloroprene rubber sheet. Among those, it is preferred that the base material be made of polyethylene terephthalate (PET) in consideration of, for example, physical characteristics (for example, dimension stability, thickness accuracy, workability, and tensile strength) and economic efficiency.

A thickness of the base material is not particularly limited. For example, the base material has a thickness of from about 4 μm to 200 μm. When the thickness of the base material falls within the range described above, the base material is less liable to have a curl or wrinkles, is excellent in transfer performance, and involves less cost.

(Adhesive Layer)

The adhesive layer includes scale-shaped fillers. A resin forming the adhesive layer is not particularly limited. For example, the adhesive layer is made of an acrylic resin, a urethane resin, a urethane-modified polyester resin, a polyester resin, an epoxy resin, an ethylene vinyl acetate copolymer resin (EVA), a vinyl resin (vinyl chloride copolymer resin, vinyl acetate copolymer resin, or vinyl chloride-vinyl acetate copolymer resin), a styrene-ethylene-butylene copolymer resin, a polyvinyl alcohol resin, a polyacrylamide resin, isobutylene rubber, isoprene rubber, natural rubber, SBR, NBR, or silicone rubber. Those resins may be dissolved in a solvent for use or may be used without any solvent.

A thickness of the adhesive layer is not particularly limited. For example, the adhesive layer has a thickness of from about 0.5 μm to about 5 μm.

(Vapor Deposition Layer)

The vapor deposition layer is not particularly limited. For example, the vapor deposition layer is at least one kind selected from the group consisting of nonmetal, metal, metal oxide, and metal nitride (also referred to as "metal or the like"). The nonmetal and the metal or the like are not particularly limited. Examples of the nonmetal include amorphous carbon (DLC) and a composite thereof. Examples of the metal or the like include at least one metal selected from the group consisting of silicon, titanium, tin, zinc, aluminum, indium, and magnesium, an oxide thereof, and a nitride thereof. Among those, it is preferred that the metal or the like be, for example, aluminum, aluminum oxide, indium, tin, silicon oxide, silicon nitride, silicon oxynitride, aluminum zinc oxide (AZO), or zinc tin oxide (ZTO), more preferably aluminum, aluminum oxide, indium or tin. When the vapor deposition layer is made of aluminum, aluminum oxide, indium or tin, a decorative film formed body to be obtained is likely to exhibit the metallic design presentation of satin plating.

A thickness of the vapor deposition layer is not particularly limited. For example, it is preferred that the vapor deposition layer have a thickness of equal to or larger than 7 nm, more preferably equal to or larger than 20 nm. Moreover, it is preferred that the vapor deposition layer have a thickness of equal to or smaller than 100 nm, more preferably equal to or smaller than 80 nm. When the thickness of the vapor deposition layer falls within the range described above, the vapor deposition layer has suitable flexibility. Thus, when the distinctness of image and the ratio (GS60°/L*45) are to be adjusted with use of fillers described later, recesses and projections are likely to be formed on a surface of the vapor deposition layer.

(Protection Layer)

In the first invention and the third invention, the protection layer is not particularly limited. Examples of a material of the protection layer include poly(meth)acrylate ester, polycarbonate, polyethylene terephthalate, polyethylene-2, 6-naphthalate, polyvinyl fluoride (PVF), polyvinylidene difluoride (PVDF), polytetrafluoroethylene (PTFE), polychlorotrifluoroethylene (PCTFE), an ethylene-tetrafluoroethylene copolymer (ETFE), an ethylene-chlorotrifluoroethylene copolymer (ECTFE), a tetrafluoroethylene-perfluoroalkylvinyl ether copolymer (PFA), and a tetrafluoroethylene-hexafluoropropylene copolymer (FEP). Only in the case of the second invention, the protection layer includes lens-shaped fillers. Other configurations of the protection layer of the second invention are similar to those of the first invention and the third invention. Moreover, only in the case of the fourth invention, the protection layer includes scale-shaped fillers. Other configurations of the protection layer of the fourth invention are similar to those of the first invention and the third invention.

A thickness of the protection layer is not particularly limited. For example, it is preferred that the protection layer have a thickness of equal to or larger than 1.0 μm and equal to or smaller than 20 μm. When the thickness of the protection layer falls within the range described above, the decorative film formed body is excellent in abrasion resistance and wear resistance.

Back to the overall description of the decorative film formed body, it is preferred that the distinctness of image be equal to or more than 10. Moreover, it is preferred that the distinctness of image be equal to or less than 92, more preferably equal to or less than 72, still more preferably equal to or less than 48. When the distinctness of image is less than 10, the decorative film formed body has an excessively high degree of matteness, with the result that the design presentation of the satin plating pattern is less likely to be expressed. Meanwhile, when the distinctness of image is more than 92, the decorative film formed body has an excessively low degree of matteness, with the result that the design presentation of the satin plating pattern is less likely to be expressed. In the present embodiment, the distinctness of image (unit: %) is measured in accordance with ASTM-D5767, and may be calculated by measuring a distinctness of image (DOI) of a surface of the formed body with use of, for example, Appearance Analyzer (Rhopoint IQ-S, manufactured by Rhopont Instruments).

It is preferred that the ratio (GS60°/L*45) be equal to or more than 5, more preferably equal to or more than 15. Moreover, it is preferred that the ratio (GS60°/L*45) be equal to or less than 55, more preferably equal to or less than 45. When the ratio (GS60°/L*45) is less than 5, the decorative film formed body has an excessively small value of GS60° or an excessively larger value of L*45, with the result that the dull metallic gloss of the satin pattern is less likely to be expressed. Meanwhile, when the ratio (GS60°/L*45) is more than 55, the decorative film formed body has an excessively large value of GS60° or an excessively small value of L*45, with the result that the metallic gloss is liable to be excessively expressed, and an appearance thereof is liable to be different from the characteristic metallic gloss of the satin pattern. In the present embodiment, the specular glossiness given when an incident angle is 60° (GS60°) can be measured by irradiating the surface of the formed body with light at an incident angle of 60° and receiving specular reflection light, for example, with use of Appearance Analyzer (Rhopoint IQ-S, manufactured by Rhopont Instruments). Moreover, the L* value given when an incident angle and an acceptance angle are 45° (L*45) can be measured by measuring color of the surface of the formed body and calculating an L value given when the incident angle and the acceptance angle are 45° with use of, for example, a multi-angle spectrophotometer (MA-T6, manufactured by X-Rite, Incorporated). The ratio (GS60°/L*45) can be calculated by dividing the obtained value of the specular glossiness (GS60°) by the value of L*45.

In the present embodiment, a method of adjusting the distinctness of image and the ratio (GS60°/L*45) within the ranges described above is not particularly limited. For example, the distinctness of image and the ratio (GS60°/L*45) of the decorative film formed body of the present embodiment may be adjusted within the ranges described above by processing a surface texture of any one of the layers or adding fillers. More specifically, the distinctness of image and the ratio (GS60°/L*45) of the decorative film formed body of the present embodiment may be adjusted within the ranges described above by (1) a method of adding fillers to form recesses and projections on a surface of any one of the layers, (2) a method of causing micro layer separation in the protection layer to form recesses and projections on the surface of the protection layer, (3) a method of volatilizing a solvent used for formation of each layer (solvent containing resin) to form a coarse surface texture of the layer, (4) a method of pressing a die having recesses and projections onto each layer to form recesses and projections on the surface, (5) a method of causing any one of the layers to include air, and (6) a method of performing laser etching on any one of the layers. In the following, as one example, a case of adding fillers to form recesses and projections on respective surfaces of the vapor deposition layer and the protection layer is exemplified.

<First Embodiment>

Figure 2:
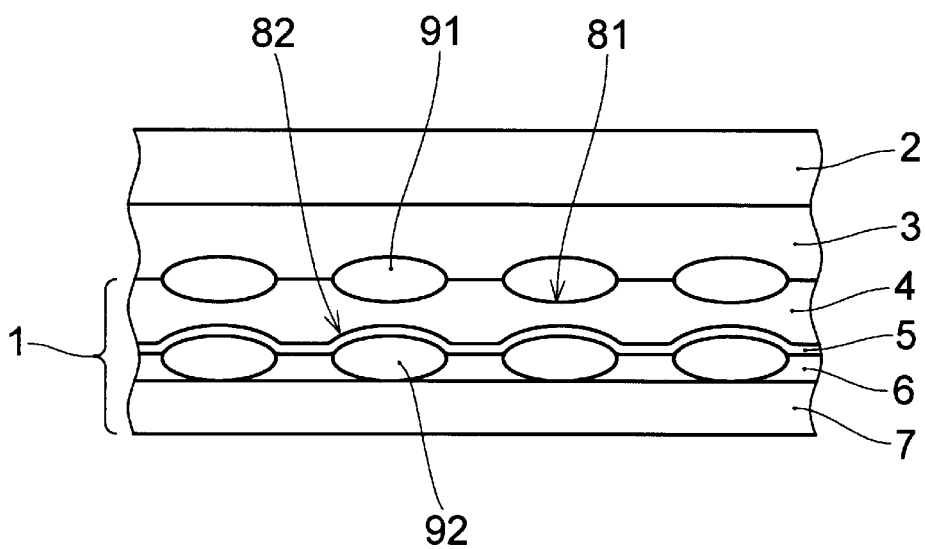
FIG. 2 is a schematic sectional view for illustrating the manufacturing method for a decorative film formed body according to one embodiment (first embodiment) of the present invention.
Figure 3:
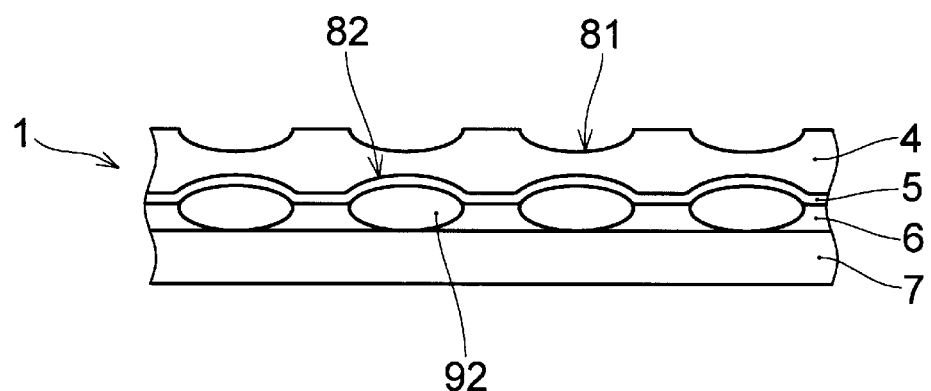
FIG. 3 is a schematic sectional view for illustrating a decorative film formed body according to one embodiment (first embodiment) of the present invention.

A decorative film formed body according to one embodiment of the present invention (first embodiment) is described with reference to FIG. 1 to FIG. 3. For clarification of description, a manufacturing method for a decorative film formed body is described, and after that, a decorative film formed body to be obtained is described. FIG. 1 is a schematic sectional view for illustrating a manufacturing method for a decorative film formed body 1 according to the present embodiment. FIG. 2 is a schematic sectional view for illustrating the manufacturing method for the decorative film formed body 1 according to the present embodiment. FIG. 3 is a schematic sectional view for illustrating the decorative film formed body 1 according to the present embodiment.

The manufacturing method for the decorative film formed body 1 and a mounting method for a transfer base material according to the present embodiment include: a release layer forming step of forming a release layer 3 on a separation base material 2; a protection layer forming step of forming a protection layer 4 on the release layer 3; a vapor deposition layer forming step of forming a vapor deposition layer 5 on the protection layer 4; an adhesive layer forming step of forming an adhesive layer 6 on the vapor deposition layer 5; a transfer base material forming step of forming a transfer base material 7 on the adhesive layer 6; and a separating step of separating the separation base material 2 and the release layer 3. The protection layer forming step includes a first recesses/projections forming step of forming recesses and projections 81 on a surface of the protection layer 4. The transfer base material forming step includes a second recesses/projections forming step of forming recesses and projections 82 on a surface of the vapor deposition layer 5. When the manufacturing method for the decorative film formed body 1 according to the present embodiment is performed through those steps, there may be manufactured the decorative film formed body 1 in which a distinctness of image is from 10 to 92 and in which a ratio (GS60°/L*45) of a specular glossiness given when an incident angle is 60° (GS60°) to an L* value given when an incident angle and an acceptance angle are 45° (L*45) is from 5 to 55. In the following, each of the steps is described.

(Release Layer Forming Step)

The release layer forming step is a step of forming the release layer 3 on the separation base material 2.

The separation base material 2 is not particularly limited. Examples of the separation base material 2 include a resin sheet, paper, fabric, a rubber sheet, and a foam sheet. Examples of the resin sheet include: a polyolefin-based resin sheet made of polyethylene (PE), polypropylene (PP), or an ethylene-propylene copolymer; a polyester-based resin sheet made of polyethylene terephthalate (PET), polybutylene terephthalate (PBT), or polyethylene naphthalate (PEN); a vinyl chloride resin sheet; a vinyl acetate resin sheet; a polyimide resin sheet; a polyamide resin sheet; a fluorocarbon resin sheet; and cellophane. Examples of the paper include Japanese paper, kraft paper, glassine paper, wood-free paper, synthetic paper, and topcoat paper. Examples of the fabric include woven fabric and nonwoven fabric formed through spinning of a single fibrous material or various fibrous materials. Examples of the rubber sheet include a natural rubber sheet and a butyl rubber sheet. Examples of the foam sheet include a foamed PE sheet, a foamed polyolefin sheet, a foamed polyester sheet, a foamed polyurethane sheet, and a foamed polychloroprene rubber sheet. Among those, it is preferred that the base material be made of polyethylene terephthalate (PET) in consideration of, for example, physical characteristics (for example, dimension stability, thickness accuracy, workability, and tensile strength) and economic efficiency.

A thickness of the separation base material 2 is not particularly limited. For example, the separation base material 2 has a thickness of from about 4 μm to 200 μm. When the thickness of the separation base material 2 falls within the range described above, the base material is less liable to have a curl or wrinkles, is excellent in transfer performance, and involves less cost.

The release layer 3 is not particularly limited. For example, the release layer 3 is a release agent made of a silicone resin, a fluororesin, a cellulose-derivative resin, a urea resin a polyolefin resin, or a melamine resin.

A method of forming the release layer 3 is not particularly limited. For example, the release layer 3 may be formed by applying a release agent on the separation base material 2 with use of a roll coater.

A thickness of the release layer 3 is not particularly limited. For example, the release layer 3 has a thickness of from about 0.01 μm to about 5 μm.

The release layer 3 of the present embodiment includes amorphous fillers. A raw material of the amorphous fillers is not particularly limited. Examples of the raw material of the amorphous fillers include melamine-based resin particles, acryl-based resin particles, acrylic styrene-based copolymer particles, polycarbonate-based particles, polyethylene-based particles, and polystyrene-based particles. Moreover, examples of inorganic fillers include silica particles, talc, and boron nitride. The amorphous fillers may be used in combination.

It is preferred that the shape of each of the amorphous fillers be a shape other than a true spherical shape, more preferably a lens-like (oval sphere) shape or a scale-like shape. When the amorphous fillers each have a shape other than the true spherical shape, the fillers do not scatter light in all directions and are less liable to have a whity appearance. As a result, the decorative film formed body 1 to be obtained is likely to express the metallic pattern of satin plating. In FIG. 1 to FIG. 3, an example of using lens-shaped fillers 91 is disclosed. An example of using scale-shaped fillers 92 (see, for example, FIG. 7) is described later as a third embodiment and a fourth embodiment.

Dimensions of each of the amorphous fillers are not particularly limited. For example, when the amorphous fillers each have a lens-like shape, it is preferred that the lens-shaped fillers 91 each have a major diameter L1 of equal to or larger than 2.0 μm, more preferably equal to or larger than 6.0 μm. Moreover, it is preferred that the lens-shaped fillers 91 each have a major diameter L1 of equal to or smaller than 20 μm, more preferably equal to or smaller than 10 μm. Moreover, it is preferred that the lens-shaped fillers 91 each have a thickness L2 of equal to or larger than 1.0 μm, more preferably equal to or larger than 2.0 μm. Moreover, it is preferred that the lens-shaped fillers 91 each have a thickness L2 of equal to or smaller than 5.0 μm, more preferably equal to or smaller than 3.0 μm. Moreover, it is preferred that the lens-shaped fillers 91 each have an aspect ratio (major diameter/thickness) of equal to or more than 1.0, more preferably equal to or more than 2.0. Moreover, it is preferred that the lens-shaped fillers 91 each have an aspect ratio of equal to or less than 10, more preferably equal to or less than 5.0. When the dimensions of each of the lens-shaped fillers 91 fall within the ranges described above, the recesses and projections 81 each having desired dimensions are likely to be formed on a surface of the protection layer 4 formed on the release layer 3 in the protection layer forming step described later. As a result, the decorative film formed body 1 to be obtained is likely to achieve, in particular, both the metallic gloss and the low distinctness of image.

When the release layer 3 including the lens-shaped fillers 91 is formed on the separation layer, the release layer 3 is cured under a state in which some of the lens-shaped fillers 91 are exposed from the surface of the release layer 3.

(Protection Layer Forming Step)

The protection layer forming step is a step of forming the protection layer 4 on the release layer 3. A raw material, dimensions, and other features of the protection layer 4 are similar to those described above.

A method of forming the protection layer 4 is not particularly limited. For example, the protection layer 4 may be formed by applying a resin solution, which is suitably dissolved in a solvent and forms the protection layer 4, on the release layer 3 with use of a roll coater.

As illustrated in FIG. 1, the protection layer 4 is formed on the release layer 3 having the lens-shaped fillers 91 exposed therefrom. As a result, the recesses and projections 81 are formed (first recesses/projections forming step) along the shape of the lens-shaped fillers 91 exposed from the release layer 3 on the surface of the protection layer 4 which is located on a side in contact with the release layer 3.

(Vapor Deposition Layer Forming Step)

The vapor deposition layer forming step is a step of forming the vapor deposition layer 5 on the protection layer 4. A raw material, dimensions, and other features of the vapor deposition layer 5 are similar to those described above.

In the vapor deposition layer forming step, a method of forming the vapor deposition layer 5 on the protection layer 4 is not particularly limited. Examples of a vapor deposition method to be suitably adopted may include physical vapor deposition methods such as a vacuum vapor deposition method, a sputtering method, and an ion plating method, and chemical vapor deposition methods, which have hitherto been well known. It is preferred that, in the manufacturing method for the decorative film formed body 1 according to the present invention, the vapor deposition layer 5 be provided by the vacuum vapor deposition method among the methods described above because of high productivity. As vapor deposition conditions, conditions having hitherto been known are suitably adopted based on a material of the vapor deposition layer 5 and a desired thickness of the vapor deposition layer 5. In the case of vapor deposition of metal, it is preferred that a metal material have less impurities and have a purity of equal to or higher than 99 weight %, more preferably 99.5 weight %. Moreover, it is preferred that the metal material be processed into a particle shape, a rod shape, a tablet shape, a wire shape, or a shape of a crucible to be used. As a heating method for vaporizing the metal material, a well-known method may be used, such as a method of performing resistance heating or high-frequency heating after placing a metal material into a crucible, a method of performing electron beam heating, a method of directly placing a metal material into a board made of ceramic such as boron nitride and directly performing resistance heating. It is desired that the crucible to be used for the vacuum vapor deposition be made of carbon, and may be a crucible made of alumina, magnesia, titania, or berylia.

(Adhesive Layer Forming Step)

The adhesive layer forming step is a step of forming the adhesive layer 6 on the vapor deposition layer 5. A raw material, dimensions, and other features of the adhesive layer 6 are similar to those described above.

A method of forming the adhesive layer 6 is not particularly limited. For example, the adhesive layer 6 may be formed by applying a resin solution, which is suitably dissolved in a solvent and forms the adhesive layer 6, on the vapor deposition layer 5 with use of a roll coater.

The adhesive layer 6 of the present embodiment includes lens-shaped fillers 92. A raw material and other features of the lens-shaped fillers 92 are similar to those described above.

It is preferred that the lens-shaped fillers 92 each have a major diameter L3 of equal to or larger than 2.0 μm and equal to or smaller than 20 μm. Moreover, it is preferred that the lens-shaped fillers 92 each have a thickness L4 of equal to or larger than 1.0 μm and equal to or smaller than 5.0 μm. Further, it is preferred that the lens-shaped fillers 92 each have an aspect ratio (major diameter/thickness) of equal to or more than 1.0 and equal to or less than 20. When the dimensions of each of the lens-shaped fillers 92 fall within the ranges described above, the recesses and projections 81 each having desired dimensions are likely to be formed on a surface of the protection layer 4 formed on the release layer 3 in the protection layer forming step described later. As a result, the decorative film formed body 1 to be obtained is likely to achieve, in particular, both the metallic gloss and the low distinctness of image. In particular, it is preferred that the lens-shaped fillers 92 each have a thickness larger than a thickness of the adhesive layer 6, more particularly larger than the thickness of the adhesive layer 6 by 0.5 μm or larger so that, in the transfer base material forming step described later, the vapor deposition layer 5 can be deformed by bringing the transfer base material 7 into abutment against the adhesive layer 6 to press the lens-shaped fillers 92 in the thickness direction of the adhesive layer 6. With this, in the transfer base material forming step described later, the vapor deposition layer 5 is likely to be deformed so that the recesses and projections 82 having the desired sizes are formed.

When the adhesive layer 6 including the lens-shaped fillers 92 is formed on the vapor deposition layer 5, the adhesive layer 6 is solidified under a state in which some of the lens-shaped fillers 92 are exposed from the surface of the adhesive layer 6.

(Transfer Base Material Forming Step)

The transfer base material forming step is a step of forming (mounting) the transfer base material 7 on the adhesive layer 6. A raw material, dimensions, and other features of the transfer base material 7 are similar to those described above.

As illustrated in FIG. 1, when the transfer base material 7 is brought into abutment against the adhesive layer 6 having the lens-shaped fillers 92 exposed therefrom, the exposed lens-shaped fillers 92 are pressed in the thickness direction of the adhesive layer 6. As a result, as illustrated in FIG. 2, the lens-shaped fillers 92 are embedded in the thickness direction of the adhesive layer 6, and the vapor deposition layer 5 is deformed. As a result, on the surface of the vapor deposition layer 5, recesses and projections 82 (projecting portions each having a substantially cup shape and projecting toward the protection layer 4 side) are formed (second recesses/projections forming step). As described above, it is preferred that the lens-shaped fillers each have a thickness larger than a thickness of the adhesive layer 6. With this, the recesses and projections 82 are likely to be formed on the surface of the vapor deposition layer 5.

It is preferred that the projecting portions each have a maximum diameter of equal to or larger than 2.0 μm and equal to or smaller than 20 μm. It is preferred that the projecting portions each have a height of equal to or larger than 0.5 μm and equal to or smaller than 5.0 μm. When the maximum diameter and the height of each of the projecting portions fall within the ranges described above, the decorative film formed body 1 to be obtained is likely to be suitably adjusted in degree of matteness, and hence the distinctness of image is likely to be adjusted so as to fall within the range described above. As a result, in the decorative film formed body 1, the distinctness of image contributing to the matteness and the glossiness contributing to the contrast are more likely to fall within predetermined ranges, thereby being capable of more accurately reproducing the metallic design presentation of satin plating with less color blur.

(Separating Step)

The separating step is a step of separating the separation base material 2 and the release layer 3 from each other. As illustrated in FIG. 3, in the separating step, the separation base material 2 and the release layer 3 (including lens-shaped fillers 91) are separated from each other. As a result, on the surface of the protection layer 4, the recesses and projections 81 (recessed portions each having a substantially cup shape recessed in the thickness direction of the protection layer 4) having a shape complementary to the lens-shaped fillers 91 exposed from the release layer 3 are formed.

It is preferred that the recessed portions each have a maximum diameter of equal to or larger than 2.0 μm and equal to or smaller than 20 μm. It is preferred that the recessed portions each have a depth of equal to or larger than 0.5 μm and equal to or smaller than 5.0 μm. When the maximum diameter and the depth of each of the recessed portions fall within the ranges described above, the decorative film formed body 1 to be obtained is likely to be suitably adjusted in degree of contrast, and hence the ratio (GS60°/L*45) is likely to be adjusted so as to fall within the range described above. As a result, in the decorative film formed body 1, the distinctness of image contributing to the matteness and the glossiness contributing to the contrast are more likely to fall within predetermined ranges, thereby being capable of more accurately reproducing the metallic design presentation of satin plating with less color blur.

The maximum diameter of each of the projecting portions or the maximum diameter of each of the recessed portions is obtained by observing a surface of the decorative film formed body from a perpendicular direction with use of an electron microscope or an optical microscope, randomly sampling twenty projecting portions or recessed portions, measuring maximum diameters of contours of the projecting portions or the recessed portions, and calculating the maximum diameter based on an average value of the twenty samples.

Through the steps described above, the decorative film formed body 1 according to the present embodiment is produced. The decorative film formed body 1 has the recesses and projections (recesses and projections 81 and recesses and projections 82) on the surfaces of the protection layer 4 and the vapor deposition layer 5. The recesses and projections 81 formed on the surface of the protection layer 4 mainly contribute to the matteness. Meanwhile, the recesses and projections 82 formed on the surface of the vapor deposition layer 5 mainly contribute to the contrast. With this, the decorative film formed body 1 is likely to be adjusted so that a distinctness of image is set to from 10 to 92 and that a ratio (GS60°/L*45) of a specular glossiness (GS60°) given when an incident angle is 60° to an L* value (L*45) given when an incident angle and an acceptance angle are 45° is set to from 5 to 55. Such decorative film formed body 1 is capable of exhibiting excellent metallic design presentation of satin plating with less color blur.

Moreover, with regard to the decorative film formed body 1 according to the present embodiment, in a case of assuming a graph in which a horizontal axis represents a distinctness of image and a vertical axis represents a ratio (GS60°/L*45), it is preferred that a position of a plot of the distinctness of image and the ratio (GS60°/L*45) be located within a lower region with respect to a primary expression y=3.33x−18.33 (region defined by the primary expression and the x-axis). With the distinctness of image and the ratio (GS60°/L*45) plotted within the region described above, the decorative film formed body 1 is capable of exhibiting more excellent metallic design presentation of sating plating with less color blur.

<Second Embodiment>

Figure 4:
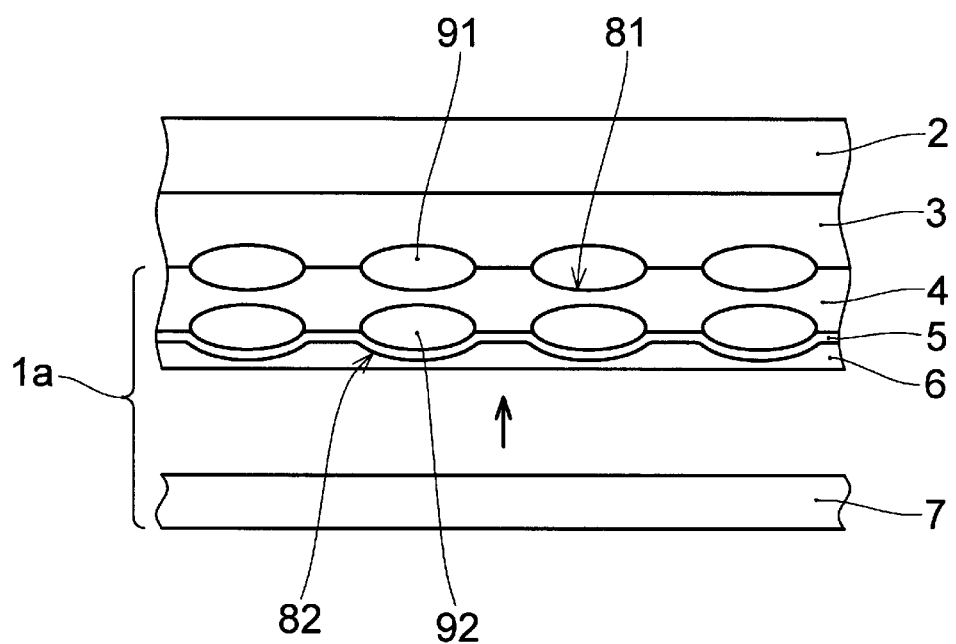
FIG. 4 is a schematic sectional view for illustrating a manufacturing method for a decorative film formed body according to one embodiment (second embodiment) of the present invention.
Figure 5:
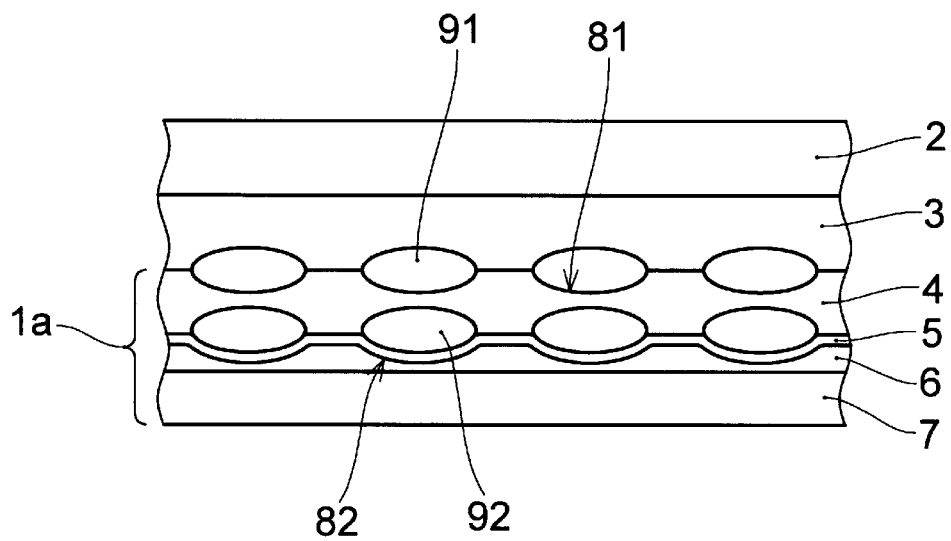
FIG. 5 is a schematic sectional view for illustrating the manufacturing method for a decorative film formed body according to one embodiment (second embodiment) of the present invention.
Figure 6:
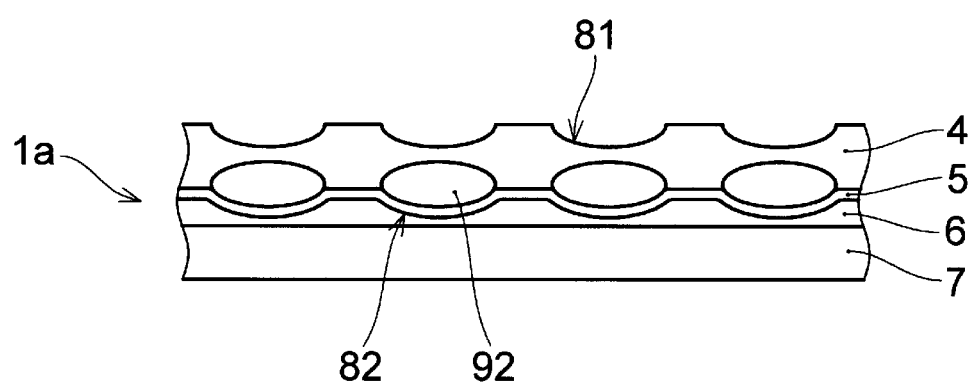
FIG. 6 is a schematic sectional view for illustrating a decorative film formed body according to one embodiment (second embodiment) of the present invention.

A decorative film formed body according to one embodiment of the present invention (second embodiment) is described with reference to FIG. 4 to FIG. 6. For clarification of description, a manufacturing method for a decorative film formed body is described, and after that, a decorative film formed body to be obtained is described. FIG. 4 is a schematic sectional view for illustrating a manufacturing method for a decorative film formed body 1a according to the present embodiment. FIG. 5 is a schematic sectional view for illustrating the manufacturing method for the decorative film formed body 1a according to the present embodiment. FIG. 6 is a schematic sectional view for illustrating the decorative film formed body 1a according to the present embodiment. The decorative film formed body 1a and the manufacturing method for the decorative film formed body 1a according to the present embodiment are similar to the decorative film formed body 1 (see FIG. 3) and the manufacturing method for the decorative film formed body 1 according to the first embodiment described above except that, in place of the mode in which the lens-shaped fillers are added to the adhesive layer 6, the lens-shaped fillers 92 are added to the protection layer 4. Therefore, redundant description is suitably omitted, and identical members are denoted by the same reference symbols.

(Release Layer Forming Step)

A release layer forming step is similar to the release layer forming step described above in relation to the first embodiment.

(Protection Layer Forming Step)

The protection layer forming step is a step of forming the protection layer 4 on the release layer 3. A raw material, dimensions, and other features of the protection layer 4 are similar to those described above.

A method of forming the protection layer 4 is not particularly limited. For example, the protection layer 4 may be formed by applying a resin solution, which is suitably dissolved in a solvent and forms the protection layer 4, on the release layer 3 with use of a roll coater.

The protection layer 4 of the present embodiment includes the lens-shaped fillers 92. A raw material, dimensions, and other features of each of the lens-shaped fillers 92 are similar to those described above.

When the protection layer 4 including the lens-shaped fillers 92 is formed on the release layer 3, the protection layer 4 is solidified under a state in which some of the lens-shaped fillers 92 are exposed from the surface of the protection layer 4.

(Vapor Deposition Layer Forming Step)

The vapor deposition layer forming step is a step of forming the vapor deposition layer 5 on the protection layer 4. A raw material, dimensions, a vapor deposition method, and other features of the vapor deposition layer 5 are similar to those described above.

As illustrated in FIG. 4, the vapor deposition layer 5 is formed on the protection layer 4 having the lens-shaped fillers 92 exposed therefrom. As a result, the vapor deposition layer 5 has the recesses and projections 82 formed on a surface thereof on a side in contact with the protection layer 4 along a shape of the lens-shaped fillers 92 exposed from the protection layer 4.

(Adhesive Layer Forming Step)

The adhesive layer forming step is a step of forming the adhesive layer 6 on the vapor deposition layer 5. A raw material, dimensions, and other features of the adhesive layer 6 are similar to those described above.

A method of forming the adhesive layer 6 is not particularly limited. For example, the adhesive layer 6 may be formed by applying a resin solution, which is suitably dissolved in a solvent and forms the adhesive layer 6, on the vapor deposition layer 5 with use of a roll coater.

(Transfer Base Material Forming Step)

The transfer base material forming step is a step of forming (mounting) the transfer base material 7 on the adhesive layer 6. A raw material, dimensions, and other features of the transfer base material 7 are similar to those described above.

(Separating Step)

The separating step is a step of separating the separation base material 2 and the release layer 3 from each other. As illustrated in FIG. 5 and FIG. 6, in the separating step, the separation base material 2 and the release layer 3 (including lens-shaped fillers 91) are separated from each other. As a result, on the surface of the protection layer 4, the recesses and projections 81 having a shape complementary to the lens-shaped fillers 91 exposed from the release layer 3 are formed.

Through the steps described above, the decorative film formed body 1a according to the present embodiment is produced. The decorative film formed body 1a has the recesses and projections (recesses and projections 81 and recesses and projections 82) on the surfaces of the protection layer 4 and the vapor deposition layer 5. The recesses and projections 81 formed on the surface of the protection layer 4 mainly contribute to the matteness. Meanwhile, the recesses and projections 82 formed on the surface of the vapor deposition layer 5 mainly contribute to the contrast. With this, the decorative film formed body 1a is likely to be adjusted so that a distinctness of image is set to from 10 to 92 and that a ratio (GS60°/L*45) of a specular glossiness (GS60°) given when an incident angle is 60° to an L* value (L*45) given when an incident angle and an acceptance angle are 45° is set to from 5 to 55. Such decorative film formed body 1a is capable of exhibiting excellent metallic design presentation of satin plating with less color blur.

<Third Embodiment>

Figure 7:
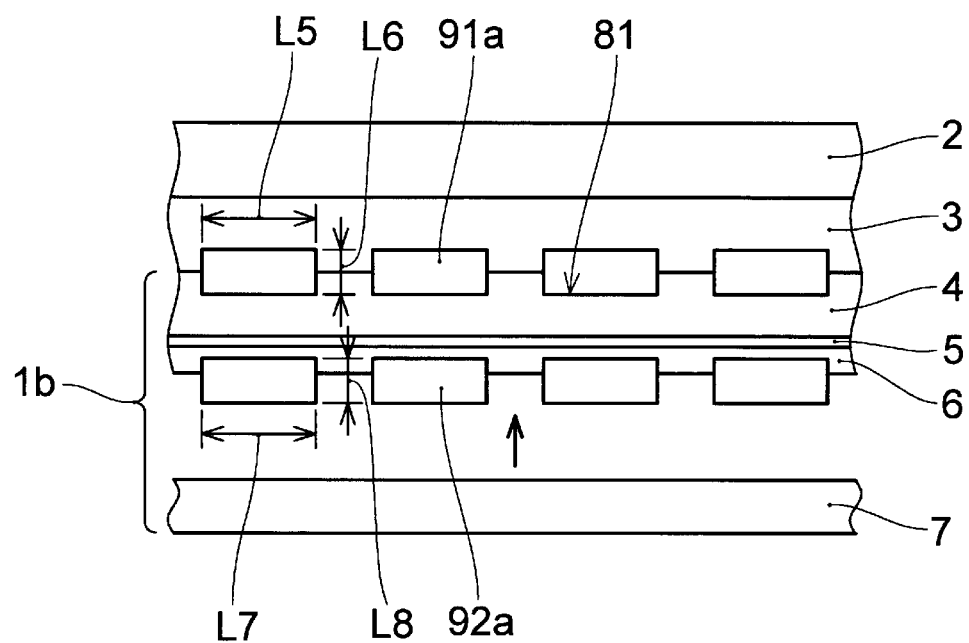
FIG. 7 is a schematic sectional view for illustrating a manufacturing method for a decorative film formed body according to one embodiment (third embodiment) of the present invention.
Figure 8:
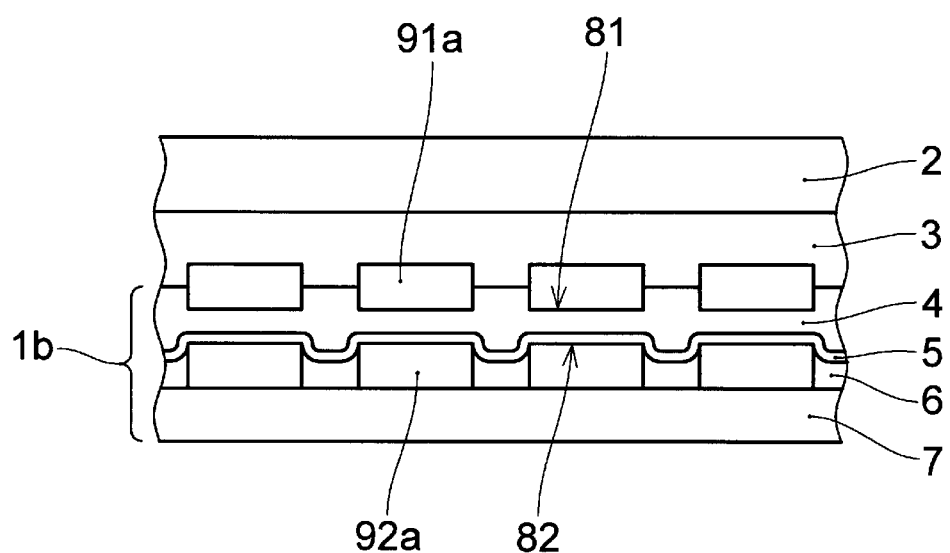
FIG. 8 is a schematic sectional view for illustrating the manufacturing method for a decorative film formed body according to one embodiment (third embodiment) of the present invention.
Figure 9:
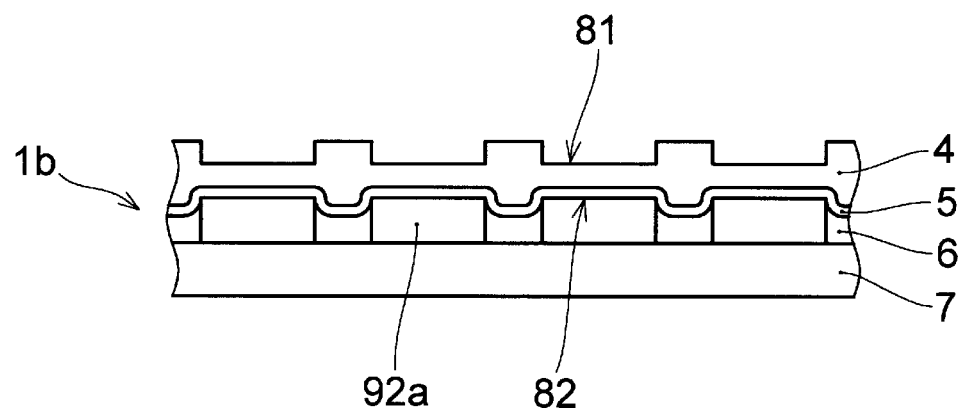
FIG. 9 is a schematic sectional view for illustrating a decorative film formed body according to one embodiment (third embodiment) of the present invention.

A decorative film formed body according to one embodiment of the present invention (third embodiment) is described with reference to FIG. 7 to FIG. 9. For clarification of description, a manufacturing method for a decorative film formed body is described, and after that, a decorative film formed body to be obtained is described. FIG. 7 is a schematic sectional view for illustrating a manufacturing method for a decorative film formed body 1b according to the present embodiment. FIG. 8 is a schematic sectional view for illustrating the manufacturing method for the decorative film formed body 1b according to the present embodiment. FIG. 9 is a schematic sectional view for illustrating the decorative film formed body 1b according to the present embodiment. The decorative film formed body 1b and the manufacturing method for the decorative film formed body 1b according to the present invention are similar to the decorative film formed body 1 (see FIG. 3) and the manufacturing method for the decorative film formed body 1 according to the first embodiment described above except that, in place of the lens-shaped fillers, scale-shaped fillers are used as the amorphous fillers. Therefore, redundant description is suitably omitted, and identical members are denoted by the same reference symbols.

(Release Layer Forming Step)

The release layer forming step is a step of forming the release layer 3 on the separation base material 2. The release layer forming step of the present embodiment is similar to the release layer forming step of the first embodiment except that scale-shaped fillers 91a are used as the amorphous fillers.

It is preferred that the fillers 91a each having a scale-like shape have a major diameter L5 of equal to or larger than 0.5 µm and equal to or smaller than 10 µm. Moreover, it is preferred that the scale-shaped fillers 91a each have a thickness L6 of equal to or larger than 0.05 µm and equal to or smaller than 0.5 µm. Further, it is preferred that the scale-shaped fillers 91a each have an aspect ratio (major diameter/thickness) of equal to or more than 10 and equal to or less than 150. When dimensions of each of the scale-shaped fillers 91a fall within the ranges described above, the recesses and projections 81 each having desired dimensions are likely to be formed on a surface of the protection layer 4 formed on the release layer 3 in the protection layer forming step described later. As a result, the decorative film formed body 1b to be obtained is likely to achieve, in particular, both the metallic gloss and low distinctness of image.

When the release layer 3 including the scale-shaped fillers 91a is formed on the separation base material 2, the release layer 3 is solidified under a state in which some of the scale-shaped fillers 91a are exposed from the surface of the release layer 3.

(Protection Layer Forming Step and Vapor Deposition Layer Forming Step)

A protection layer forming step and a vapor deposition layer forming step are similar to the protection layer forming step and the vapor deposition layer forming step of the first embodiment.

(Adhesive Layer Forming Step)

The adhesive layer forming step is a step of forming the adhesive layer 6 on the vapor deposition layer 5. A raw material, dimensions, and other features of the adhesive layer 6 are similar to those described above.

A method of forming the adhesive layer 6 is not particularly limited. For example, the adhesive layer 6 may be formed by applying a resin solution, which is suitably dissolved in a solvent and forms the adhesive layer 6, on the vapor deposition layer 5 with use of a roll coater.

The adhesive layer 6 of the present embodiment includes scale-shaped fillers 92a. A raw material and other features of each of the scale-shaped fillers 92a are similar to those described above. Moreover, a major diameter L7 and a thickness L8 of each of the scale-shaped fillers 92a are similar to the major diameter L5 and the thickness L6 of each of the scale-shaped fillers 91a described above. In particular, it is preferred that the scale-shaped fillers 92a each have a thickness larger than a thickness of the adhesive layer 6 so that, in the transfer base material forming step described later, the vapor deposition layer 5 can be deformed by bringing the transfer base material 7 into abutment against the adhesive layer 6 to press the scale-shaped fillers 92a in the thickness direction of the adhesive layer 6. Meanwhile, even when the thickness of each of the scale-shaped fillers 92a is small, as long as the recesses and projections are formed on the surface of the adhesive layer 6, in the transfer base material forming step described later, the vapor deposition layer 5 is likely to be deformed so that the recesses and projections 82 each having desired sizes are formed.

When the adhesive layer 6 including the scale-shaped fillers 92a is formed on the vapor deposition layer 5, the adhesive layer 6 is solidified under a state in which some of the scale-shaped fillers 92a are exposed from the surface of the adhesive layer 6.

(Transfer Base Material Forming Step)

The transfer base material forming step is a step of forming (mounting) the transfer base material 7 on the adhesive layer 6. The transfer base material forming step of the present embodiment is similar to the transfer base material forming step of the first embodiment except that the scale-shaped fillers 92a are used as the amorphous fillers.

As illustrated in FIG. 7, when the transfer base material 7 is brought into abutment against the adhesive layer 6 having the scale-shaped fillers 92a exposed therefrom, the exposed scale-shaped fillers 92a are pressed in the thickness direction of the adhesive layer 6. As a result, as illustrated in FIG. 8, the scale-shaped fillers 92a are embedded in the thickness direction of the adhesive layer 6, and the vapor deposition layer 5 is deformed. As a result, on the surface of the vapor deposition layer 5, recesses and projections 82 (projecting portions each having a substantially cup shape and projecting toward the protection layer 4 side) are formed. As described above, it is preferred that the scale-shaped fillers 92a each have a thickness larger than a thickness of the adhesive layer 6. With this, the recesses and projections 82 are likely to be formed on the surface of the vapor deposition layer 5.

The recesses and projections 82 formed on the vapor deposition layer 5 are recesses and projections formed so as to follow the shape of the scale-shaped fillers 92a. Therefore, the shape of each of the recesses and projections 82 is not a rectangular sectional shape in strict sense and is a substantially rectangular shape with somewhat rounded corners.

(Separating Step)

The separating step is a step of separating the separation base material 2 and the release layer 3 from each other. As illustrated in FIG. 9, in the separating step, the separation base material 2 and the release layer 3 (including the scale-shaped fillers 91a) are separated from each other. As a result, on the surface of the protection layer 4, the recesses and projections 81 having a shape complementary to the scale-shaped fillers 91a exposed from the release layer 3 is formed. The recesses and projections formed on the surface of the protection layer 4 are recesses and projections formed so as to follow the shape of the scale-shaped fillers 91a. Therefore, the shape of each of the recesses and projections 81 is not a rectangular sectional shape in strict sense and is a substantially rectangular shape with somewhat rounded corners.

Through the steps described above, the decorative film formed body 1b according to the present embodiment is produced. The decorative film formed body 1b has the recesses and projections (recesses and projections 81 and recesses and projections 82) on the surfaces of the protection layer 4 and the vapor deposition layer 5. The recesses and projections 81 formed on the surface of the protection layer 4 mainly contribute to the matteness. Meanwhile, the recesses and projections 82 formed on the surface of the vapor deposition layer 5 mainly contribute to the contrast. With this, the decorative film formed body 1b is likely to be adjusted so that a distinctness of image is set to from 10 to 92 and that a ratio (GS60°/L*45) of a specular glossiness (GS60°) given when an incident angle is 60° to an L* value (L*45) given when an incident angle and an acceptance angle are 45° is set to from 5 to 55. Such decorative film formed body 1b is capable of exhibiting excellent metallic design presentation of satin plating with less color blur.

<Fourth Embodiment>

Figure 10:
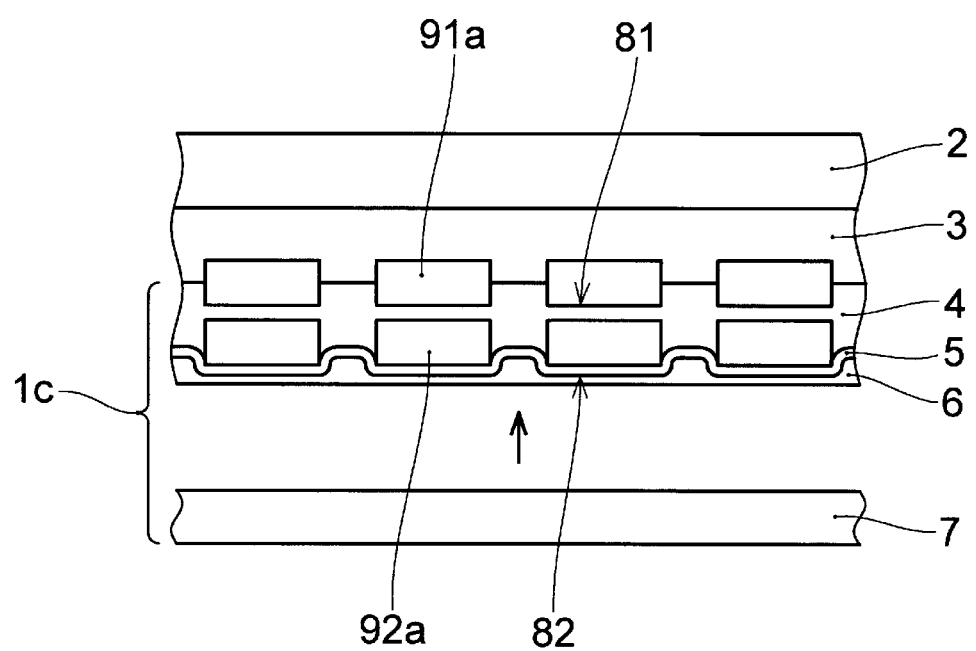
FIG. 10 is a schematic sectional view for illustrating a manufacturing method for a decorative film formed body according to one embodiment (fourth embodiment) of the present invention.
Figure 11:
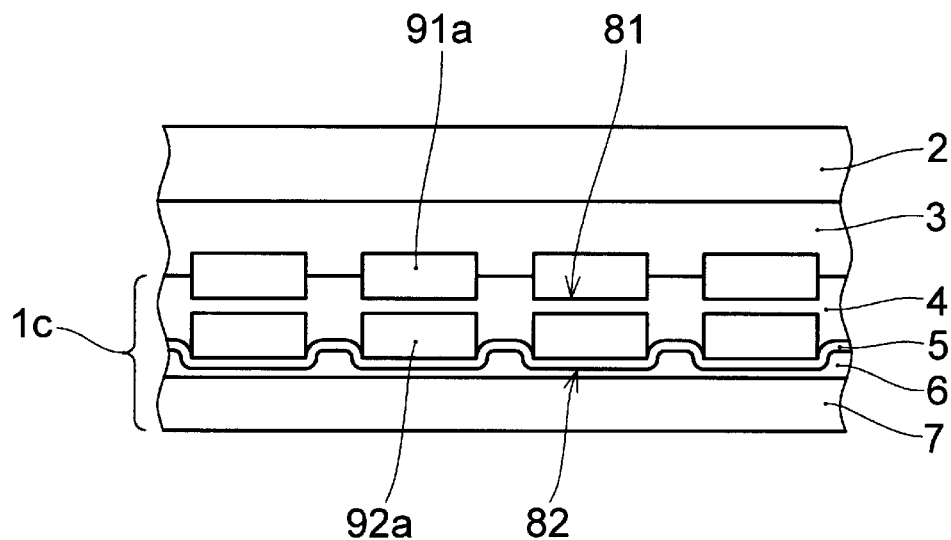
FIG. 11 is a schematic sectional view for illustrating the manufacturing method for a decorative film formed body according to one embodiment (fourth embodiment) of the present invention.
Figure 12:
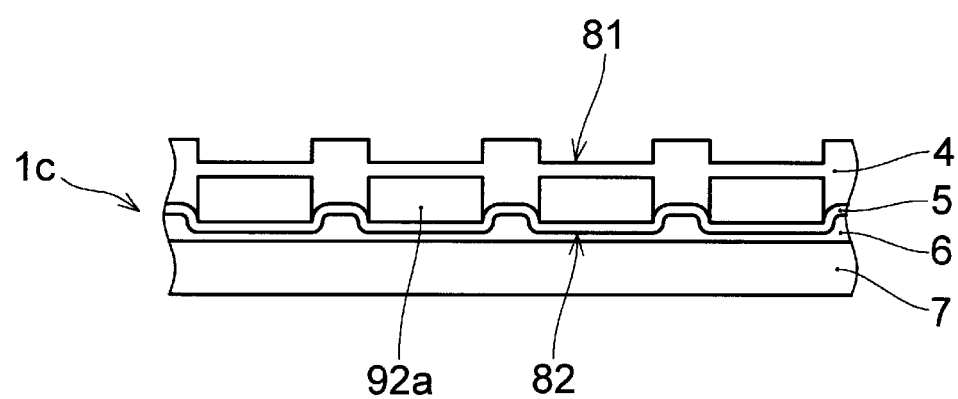
FIG. 12 is a schematic sectional view for illustrating a decorative film formed body according to one embodiment (fourth embodiment) of the present invention.

A decorative film formed body according to one embodiment of the present invention (fourth embodiment) is described with reference to FIG. 10 to FIG. 12. For clarification of description, a manufacturing method for a decorative film formed body is described, and after that, a decorative film formed body to be obtained is described. FIG. 10 is a schematic sectional view for illustrating a manufacturing method for a decorative film formed body 1c according to the present embodiment. FIG. 11 is a schematic sectional view for illustrating the manufacturing method for the decorative film formed body 1c according to the present embodiment. FIG. 12 is a schematic sectional view for illustrating the decorative film formed body 1c according to the present embodiment. The decorative film formed body 1c and the manufacturing method for the decorative film formed body 1c according to the present embodiment are similar to the decorative film formed body 1a (see FIG. 6) and the manufacturing method for the decorative film formed body 1a according to the second embodiment described above except that, in place of the lens-shaped fillers, the scale-shaped fillers are used as the amorphous fillers. Therefore, redundant description is suitably omitted, and identical members are denoted by the same reference symbols.

(Release Layer Forming Step)

The release layer forming step is a step of forming the release layer 3 on the separation base material 2. The release layer forming step of the present embodiment is similar to the release layer forming step of the second embodiment except that the scale-shaped fillers 91a are used as the amorphous fillers. Moreover, dimensions of each of the scale-shaped fillers 91a are similar to the dimensions described above in the third embodiment.

When the release layer 3 including the scale-shaped fillers is formed on the separation layer, the release layer 3 is solidified under a state in which some of the scale-shaped fillers 91a are exposed from the surface of the release layer 3.

(Protection Layer Forming Step to Separating Step)

The protection layer forming step to the separating step are similar to the protection layer forming step and the vapor deposition layer forming step of the second embodiment except that the scale-shaped fillers 92a are used as the amorphous fillers. Moreover, dimensions of each of the scale-shaped fillers 92a are similar to the dimensions described above in the third embodiment.

Through the steps described above, the decorative film formed body 1c according to the present embodiment is produced. The decorative film formed body 1c has the recesses and projections (recesses and projections 81 and recesses and projections 82) on the surfaces of the protection layer 4 and the vapor deposition layer 5. The recesses and projections 81 formed on the surface of the protection layer 4 mainly contribute to the matteness. Meanwhile, the recesses and projections 82 formed on the surface of the vapor deposition layer 5 mainly contribute to the contrast. With this, the decorative film formed body 1c is likely to be adjusted so that a distinctness of image is set to from 10 to 92 and that a ratio (GS60°/L*45) of a specular glossiness (GS60°) given when an incident angle is 60° to an L* value (L*45) given when an incident angle and an acceptance angle are 45° is set to from 5 to 55. Such decorative film formed body 1c is capable of exhibiting excellent metallic design presentation of satin plating with less color blur.

The decorative film formed bodies produced in the embodiments described above (the first embodiment to the fourth embodiment) each exhibit excellent metallic design presentation of satin plating with less color blur. Therefore, such decorative film formed bodies can be used for various products having the metallic pattern of satin plating (satin-plated preparation, for example, various containers, various casings and various vehicle interior/exterior members). With this, the satin-plated preparation to be obtained exhibits excellent metallic design presentation of satin plating with less color blur.

In particular, the decorative film formed bodies according to the present embodiments are applied to various containers, thereby being capable of obtaining various containers exhibiting excellent metallic design presentation of satin plating with less color blur with regard to containers for which an outer appearance with gloss presentation and luxurious presentation are desired, such as a container for cosmetics and a container for beverage.

Moreover, the decorative film formed bodies according to the present embodiments are applied to various casings, thereby being capable of obtaining various casings exhibiting excellent metallic design presentation of satin plating with less color blur with regard to casings for which an outer appearance with gloss presentation and luxurious presentation are desired, such as casings for communication devices like a mobile phone and home electric appliances.

Further, the decorative film formed bodies according to the present embodiments are applied to various vehicle interior/exterior members, thereby being capable of obtaining various vehicle interior/exterior members exhibiting excellent metallic design presentation of satin plating with less color blur with regard to various vehicle interior/exterior members for which an outer appearance with gloss presentation and luxurious presentation are desired.

Besides, the decorative film formed bodies according to the present embodiments are favorably applied to a part or an entirety of items for which security and inimitability, such as a membership certificate, a product tag, a patient registration card, a student identification card, a cash card, a credit card, a boarding ticket, a mileage card, a point card, and a magnetic card, in which identification information of a customer, an item, and the like are stored.

Moreover, in the embodiments described above, description is made of the example case in which the recesses and projections formed on the surface of the protection layer are recessed portions. In place of this configuration, projecting portions may be formed on the surface of the protection layer. In this case, for example, the projecting portions on the surface of the protection layer may be formed by adding fillers each having a large particle diameter to the adhesive layer, pushing up the fillers at the time of transfer similarly to the contents of the embodiments, and affecting not only the metal layer but also the surface of the protection layer.

Figure 13:
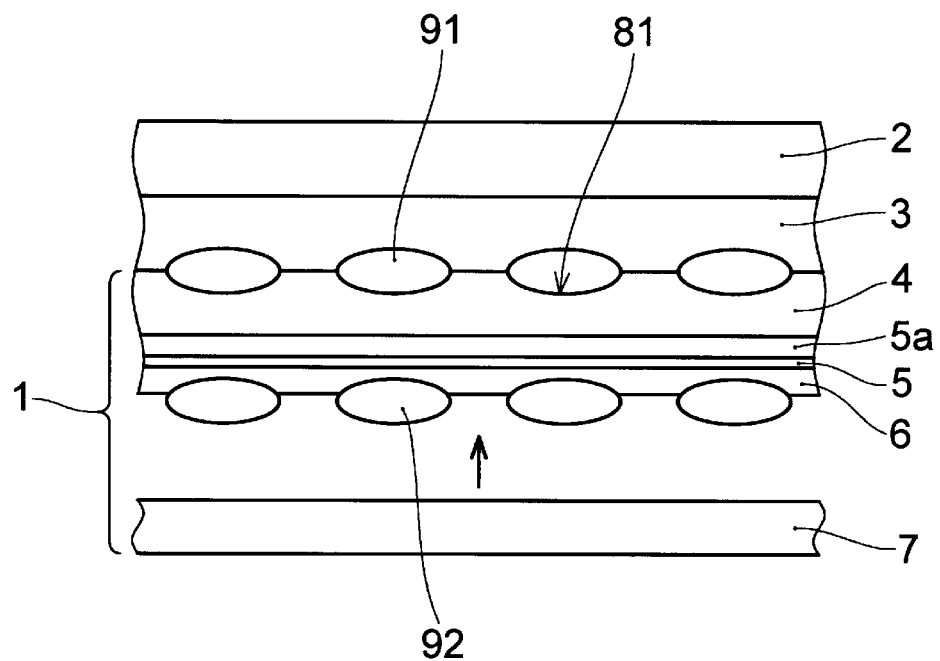
FIG. 13 is a schematic sectional view for illustrating a decorative film formed body in a modification example of one embodiment of the present invention.

Further, in the embodiments described above, as the vapor deposition layer forming step, there is exemplified the step of forming the vapor deposition layer on the protection layer. In place of this, the vapor deposition layer forming step may be a step of forming the vapor deposition anchor layer on the protection layer and then forming the vapor deposition layer on the vapor deposition anchor layer. FIG. 13 is a schematic sectional view for illustrating the decorative film formed body obtained by forming a vapor deposition anchor layer 5a on the protection layer 4 and then forming the vapor deposition layer 5 on the vapor deposition anchor layer 5a.

The vapor deposition anchor layer 5a is preferably provided to improve the adhesion between the protection layer 4 and the vapor deposition layer 5. The vapor deposition anchor layer 5a is not particularly limited. For example, it is only required that the vapor deposition anchor layer 5a exhibit excellent adhesion with respect to the protection layer 4 and be made of a raw material that is likely to receive the metal forming the vapor deposition layer 5. Examples of the raw material include acryl-based resin, nitrocellulose-based resin, polyurethane-based resin, polyester-based resin, styrene-male-based acid resin, and chlorinated PP-based resin.

A method of forming the vapor deposition anchor layer 5a is not particularly limited. For example, the vapor deposition anchor layer 5a may be formed by applying a resin solution, which is suitably dissolved in a solvent and forms the vapor deposition anchor layer 5a, on the protection layer 4 with use of a roll coater.

A thickness of the vapor deposition anchor layer 5a is not particularly limited. For example, it is preferred that the vapor deposition anchor layer 5a have a thickness of from 0.1 μm to 3 μm.

EXAMPLE

Now, the present invention is described more specifically with reference to Examples. The present invention is not limited to those Examples. Unless otherwise limited, "%" corresponds to "mass %", and "part" corresponds to "parts by mass".

Example 1

With a polyethylene terephthalate (PET) film (thickness: 25 μm) as a separation base material, lens-shaped fillers (acryl, manufactured by SEKISUI PLASTICS CO., LTD., dimension: major diameter 7.2 μm, thickness 2.8 μm, additive amount: 5 parts) were incorporated into acrylic styrene resin (additive amount: 91 parts) and a curing agent (isocyanate, additive amount: 9 parts), and a resultant was applied with use of a bar coater. This uncured resin layer was cured at 50° C. with a duration of 48 hours, thereby producing a release layer (thickness: 1.0 μm) (release layer forming step). The fillers were exposed from the surface of the release layer. A polyfunctional acrylate resin solution (97 parts) and a photopolymerization curing agent (additive amount: 3 part) were applied on the release layer with use of a bar coater, thereby producing a protection layer (thickness: 5.0 μm) (protection layer forming step). Acrylic resin (additive amount: 100 parts) was applied on the protection layer with use of a bar coater. This uncured resin layer was cured at 110° C. with a duration of 30 seconds, thereby producing a vapor deposition anchor layer (thickness: 1.0 μm). Vacuum vapor deposition of indium was performed on the vapor deposition anchor layer with use of a resistance heating vapor deposition machine. An indium film (vapor deposition layer) having a thickness of 50 nm was formed (vapor deposition layer forming step). Acrylic resin (additive amount: 38 parts), a urethane resin solution (additive amount: 57 parts), and lens-shaped fillers (acryl, manufactured by SEKISUI PLASTICS CO., LTD., dimension: major diameter 7.2 μm, thickness 2.8 μm, additive amount: 5 parts) were applied on the vapor deposition layer with use of a bar coater, thereby producing an adhesive layer (thickness: 1.0 μm) (adhesive layer forming step). With use of an up-down transfer machine (manufactured by Navitas CO., LTD., MP-6), a black ABS sheet (transfer base material) was pressed against the adhesive layer under the conditions with a pressing load of 1 kN, a stamping temperature of 180° C., and a transfer time of 1.0 second to embed the fillers into the adhesive layer (transfer base material forming step). As a result, the vapor deposition layer was deformed, and the recesses and projections were formed on the surface of the vapor deposition layer (details of recesses and projections: projecting shape with an average major diameter of 4.1 μm and a height of from 0.3 μm to 0.5 μm). Next, the separation base material and the release layer were separated, and the recesses and projections were formed on the protection layer (details of recesses and projections: a recessed shape with an average diameter of 7.2 µm and a depth of from 1.0 µm to 1.5 µm). After that, with use of an ultraviolet ray curing device (manufactured by EYE GRAPHICS Co., Ltd., ECS-4011GX, high-pressure mercury lamp), the protection layer was cured with an integrated light intensity of 500 mJ/cm$^2$, thereby obtaining a decorative film formed body.

Example 2

A decorative film formed body was produced by a method similar to that of Example 1 except that the following steps were adopted as the release layer forming step and the adhesive layer forming step. In the release layer forming step, lens-shaped fillers (composition: acryl, manufactured by SEKISUI PLASTICS CO., LTD., dimension: major diameter 2.9 µm, thickness 2.1 µm, additive amount: 10 parts) were incorporated into acrylic styrene resin (additive amount: 91 parts) and a curing agent (additive amount: 9 part), and a resultant was applied with use of a bar coater. After that, the resultant was dried with a dryer and cured at 50° C. with a duration of 48 hours, thereby producing a release layer (thickness: 1.0 µm) (release layer forming step). In the adhesive layer forming step, amorphous fillers (AEROSIL 300, manufactured by NIPPON AEROSIL CO., LTD., primary particles about 7 nm, specific surface area 300 g/m$^2$, additive amount: 3 parts) were incorporated into acrylic resin (additive amount: 39 parts) and a urethane resin solution (additive amount: 58 parts), and a resultant was applied with use of a bar coater and dried at 110° C. with a duration of 30 seconds, thereby producing an adhesive layer (thickness: 1.0 µm) (adhesive layer forming step).

Example 3

A decorative film formed body was produced by a method similar to that of Example 1 except that the following steps were adopted as the release layer forming step and the adhesive layer forming step. In the release layer forming step, scale-shaped fillers (boron nitride, manufactured by Denka Company Limited., GP, dimension: major diameter 4.1 µm, thickness 0.2 µm, additive amount: 10 parts) were incorporated into an acrylic styrene resin solution (additive amount: 82 parts) and a curing agent (isocyanate, additive amount: 8 parts), and a resultant was applied with use of a bar coater. This uncured resin layer was cured at 50° C. with a duration of 48 hours, thereby producing a release layer (thickness: 1.0 µm) (release layer forming step). In the adhesive layer forming step, scale-shaped fillers (boron nitride, manufactured by Denka Company Limited., GP, dimension: major diameter 4.1 µm, thickness 0.2 µm, additive amount: 10 parts) and amorphous fillers (AEROSIL 300, manufactured by NIPPON AEROSIL CO., LTD., primary particles about 7 nm, specific surface area 300 g/m$^2$, additive amount: 5 parts) was incorporated into acrylic resin (additive amount: 34 parts) and urethane resin (additive amount: 51 parts), and a resultant was applied with use of a bar coater, thereby producing an adhesive layer (thickness: 1.0 µm) (adhesive layer forming step).

Example 4

A decorative film formed body was produced by a method similar to that of Example 1 except that the following steps were adopted as the release layer forming step and the adhesive layer forming step. In the release layer forming step, scale-shaped fillers (boron nitride, manufactured by Denka Company Limited., GP, dimension: major diameter 4.1 µm, thickness 0.2 µm, additive amount: 10 parts) were incorporated into acrylic styrene resin (additive amount: 82 parts) and a curing agent (isocyanate, additive amount: 8 parts), and a resultant was applied with use of a bar coater. This uncured resin layer was cured at 50° C. with a duration of 48 hours, thereby producing a release layer (thickness: 1.0 µm) (release layer forming step). In the adhesive layer forming step, amorphous fillers (AEROSIL 300, manufactured by NIPPON AEROSIL CO., LTD., primary particles about 7 nm, specific surface area 300 g/m$^2$, additive amount: 5 parts) were incorporated into acrylic resin (additive amount: 38 parts) and urethane resin (additive amount: 57 parts), and a resultant was applied with use of a bar coater, thereby producing an adhesive layer (thickness: 1.0 µm) (adhesive layer forming step).

Example 5

A decorative film formed body was produced by a method similar to that of Example 1 except that the following steps were adopted as the release layer forming step and the adhesive layer forming step. In the release layer forming step, acrylic styrene resin (content percentage: 91%) and a curing agent (isocyanate, content percentage: 9%) having no filler incorporated therein were applied with use of a bar coater. This uncured resin layer was cured at 50° C. with a duration of 48 hours, thereby producing a release layer (thickness: 1.0 µm) (release layer forming step). In the adhesive layer forming step, scale-shaped fillers (boron nitride, manufactured by Denka Company Limited., product name: GP, dimension: major diameter 4.1 µm, thickness 0.2 µm, additive amount:10 parts) were incorporated into an acrylic resin solution (additive amount: 36 parts) and a urethane resin solution (additive amount: 54 parts), and a resultant was applied with use of a bar coater, thereby producing an adhesive layer (thickness: 1.0 µm) (adhesive layer forming step).

Example 6

As the release layer forming step and the adhesive layer forming step, except that the following steps were adopted, a decorative film formed body was produced by a method similar to that of Example 1. In the release layer forming step, acrylic styrene resin (additive amount: 91 parts) and a curing agent (isocyanate, content percentage: 9 parts) having no filler incorporated therein was applied with use of a bar coater. This uncured resin layer was cured at 50° C. with a duration of 48 hours, thereby producing a release layer (thickness: 1.0 µm) (release layer forming step). In the adhesive layer forming step, scale-shaped fillers (boron nitride, manufactured by Denka Company Limited., GP, dimension: major diameter 4.1 µm, thickness 0.2 µm, additive amount: 30 parts) were incorporated into an acrylic resin solution (additive amount: 28 parts) and a urethane resin solution (additive amount: 42 parts), and a resultant was applied with use of a bar coater, thereby producing an adhesive layer (thickness: 1.0 µm) (adhesive layer forming step).

Example 7

A decorative film formed body was produced by a method similar to that of Example 1 except that the following steps were adopted as the release layer forming step and the adhesive layer forming step. In the release layer forming step, acrylic styrene resin (additive amount: 91 parts) and a curing agent (isocyanate, additive amount: 9 parts) having no filler incorporated therein were applied with use of a bar coater. This uncured resin layer was cured at 50° C. with a duration of 48 hours, thereby producing a release layer (thickness: 1.0 µm) (release layer forming step). In the adhesive layer forming step, amorphous fillers (AEROSIL 300, manufactured by NIPPON AEROSIL CO., LTD., primary particles about 7 nm, specific surface area 300 g/m$^2$, additive amount: 3 parts) were incorporated into acrylic resin (additive amount: 39 parts) and urethane resin (additive amount: 58 parts), and a resultant was applied with use of a bar coater, thereby producing an adhesive layer (thickness: 1.0 µm) (adhesive layer forming step).

Example 8

With a polyethylene terephthalate (PET) film (thickness: 25 µm) as a separation base material, lens-shaped fillers (acryl, manufactured by SEKISUI PLASTICS CO., LTD., dimension: major diameter 7.2 µm, thickness 2.8 µm, additive amount: 8 parts) were incorporated into acrylic melamine resin (additive amount: 93 parts) and a curing agent (p-toluenesulfonic acid, additive amount: 7 parts), and a resultant was applied with use of a bar coater. This uncured resin layer was cured at 150° C. with a duration of 60 seconds, thereby producing a release layer (thickness: 1.0 µm) (release layer forming step). The fillers were exposed from the surface of the release layer. The lens-shaped fillers (acryl, manufactured by SEKISUI PLASTICS CO., LTD., dimension: major diameter 7.2 µm, thickness 2.8 µm, content percentage: 30%) were incorporated into polyfunctional acrylate resin, and a resultant was applied on the release layer with use of a bar coater. With use of an ultraviolet ray curing device (manufactured by EYE GRAPHICS Co., Ltd., ECS-4011GX, high-pressure mercury lamp), the uncured resin was cured under a condition with an integrated light intensity of 500 mJ/cm$^2$, thereby producing a protection layer (thickness: 2.5 µm) (protection layer forming step). Acrylic resin (additive amount: 86 parts) and a curing agent (isocyanate, additive amount: 14 parts) were applied on the protection layer with use of a bar coater. This uncured resin layer was cured at 150° C. with a duration of 60 seconds, thereby producing the vapor deposition anchor layer (thickness: 1.0 µm). Vacuum vapor deposition of indium was performed on the vapor deposition anchor layer with use of a resistance heating vapor deposition machine. An indium film (vapor deposition layer) having a thickness of 50 nm was formed (vapor deposition layer forming step). Polyethylene resin was applied on the vapor deposition layer with use of a bar coater, thereby producing an adhesive layer (thickness: 1.0 µm) (adhesive layer forming step). With use of a roll transfer machine (manufactured by Navitas CO., LTD., RT150B), a black ABS sheet (transfer base material) was pressed against the adhesive layer under conditions of temperature: 180° C., speed: 30 mm/sec. Next, the separation base material and the release layer were separated, and the recesses and projections were formed on the surface of the protection layer, thereby obtaining a decorative film formed body.

Example 9

A decorative film formed body was produced by a method similar to that of Example 8 except that the following step was adopted as the release layer forming step. In the release layer forming step, lens-shaped fillers (acryl, manufactured by SEKISUI PLASTICS CO., LTD., dimension: major diameter 7.2 µm, thickness 2.8 µm, additive amount: 8 parts) were incorporated into acrylic melamine resin (additive amount: 93 parts) and a curing agent (p-toluenesulfonic acid, additive amount: 7 parts), and a resultant was applied with use of a bar coater. This uncured resin layer was cured at 150° C. with a duration of 60 seconds, thereby producing a release layer (thickness: 0.5 µm) (release layer forming step).

Example 10

A decorative film formed body was produced by a method similar to that of Example 1 except that the following steps were adopted as the release layer forming step and the protection layer forming step. In the release layer forming step, acrylic melamine resin (additive amount: 93 parts) and a curing agent (p-toluenesulfonic acid, additive amount: 7 parts) having no filler incorporated therein were applied with use of a bar coater. This uncured resin layer was cured at 150° C. with a duration of 60 seconds, thereby producing a release layer (thickness: 1.0 µm) (release layer forming step). In the protection layer forming step, lens-shaped fillers (acryl, manufactured by SEKISUI PLASTICS CO., LTD., dimension: major diameter (i) 2.9 µm, (ii) 9.6 µm, thickness (i) 2.1 µm, (ii) 2.6 µm, (i) 6.7%, (ii) 3.3%) were incorporated into the polyfunctional acrylate resin, and a resultant was applied with use of a bar coater. With use of an ultraviolet ray curing device (manufactured by EYE GRAPHICS Co., Ltd., ECS-4011GX, high-pressure mercury lamp), the uncured resin was cured under a condition with an integrated light intensity of 500 mJ/cm$^2$, thereby producing a protection layer (thickness: 2.0 µm) (protection layer forming step).

Example 11

A decorative film formed body was produced by a method similar to that of Example 8 except that the following steps were adopted as the release layer forming step, the protection layer forming step, and the vapor deposition layer forming step. In the release layer forming step, acrylic melamine resin (additive amount: 93 parts) and a curing agent (p-toluenesulfonic acid, additive amount: 7 parts) having no filler incorporated therein were applied with use of a bar coater. This uncured resin layer was cured at 150° C. with a duration of 60 seconds, thereby producing a release layer (thickness: 1.0 µm) (release layer forming step). In the protection layer forming step, lens-shaped fillers (acryl, manufactured by SEKISUI PLASTICS CO., LTD., dimension: major diameter 7.2 µm, thickness 2.8 µm, additive amount: 5%) were incorporated into a polyfunctional acrylate resin solution, and a resultant was applied with use of a bar coater. With use of an ultraviolet ray curing device (manufactured by EYE GRAPHICS Co., Ltd., ECS-4011GX, high-pressure mercury lamp), the uncured resin was cured under a condition with an integrated light intensity of 500 mJ/cm$^2$, thereby producing a protection layer (thickness: 2.0 µm) (protection layer forming step). In the vapor deposition layer forming step, vacuum vapor deposition of aluminum was performed with use of a resistance heating vapor deposition machine. An aluminum film (vapor deposition layer) having a thickness of 50 nm was formed (vapor deposition layer forming step).

Example 12

A decorative film formed body was produced by a method similar to that of Example 8 except that the following steps were adopted as the release layer forming step and the protection layer forming step. In the release layer forming step, acrylic melamine resin (additive amount: 93 parts) and a curing agent (p-toluenesulfonic acid, additive amount: 7 parts) having no filler incorporated therein were applied with use of a bar coater. This uncured resin layer was cured at 150° C. with a duration of 60 seconds, thereby producing a release layer (thickness: 1.0 μm) (release layer forming step). In the protection layer forming step, amorphous fillers (silica, Sylophobic 100, manufactured by FUJI SILYSIA CHEMICAL LTD., dimension: average particle diameter 2.7 μm, additive amount: 0.5%) were incorporated into polyfunctional acrylate resin, and a resultant was applied with use of a bar coater. With use of an ultraviolet ray curing device (manufactured by EYE GRAPHICS Co., Ltd., ECS-4011GX, high-pressure mercury lamp), the uncured resin was cured under a condition with an integrated light intensity of 500 mJ/cm$^2$, thereby producing a protection layer (thickness: 2.0 μm) (protection layer forming step).

Example 13

A decorative film formed body was produced by a method similar to that of Example 8 except that the following steps were adopted as the release layer forming step and the protection layer forming step. In the release layer forming step, acrylic melamine resin (additive amount: 93%) and a curing agent (p-toluenesulfonic acid, additive amount: 7%) having no filler incorporated therein was applied with use of a bar coater. This uncured resin layer was cured at 150° C. with a duration of 60 seconds, thereby producing a release layer (thickness: 1.0 μm) (release layer forming step). In the protection layer forming step, amorphous fillers (silica, Sylophobic 100, manufactured by FUJI SILYSIA CHEMICAL LTD., dimension: average particle diameter 2.7 μm, additive amount: 1.0%) were incorporated into polyfunctional acrylate resin, and a resultant was applied with use of a bar coater. With use of an ultraviolet ray curing device (manufactured by EYE GRAPHICS Co., Ltd., ECS-4011GX, high-pressure mercury lamp), the uncured resin was cured under a condition with an integrated light intensity of 500 mJ/cm$^2$, thereby producing a protection layer (thickness: 2.0 μm) (protection layer forming step).

Example 14

A decorative film formed body was produced by a method similar to that of Example 8 except that the following steps were adopted as the release layer forming step and the protection layer forming step. In the release layer forming step, acrylic melamine resin (additive amount: 93 parts) and a curing agent (p-toluenesulfonic acid, additive amount: 7 parts) having no filler incorporated therein were applied with use of a bar coater. This uncured resin layer was cured at 150° C. with a duration of 60 seconds, thereby producing a release layer (thickness: 1.0 μm) (release layer forming step). In the protection layer forming step, amorphous fillers (silica, Sylophobic 100, manufactured by FUJI SILYSIA CHEMICAL LTD., dimension: average particle diameter 2.7 μm, additive amount: 1.5%) were incorporated into polyfunctional acrylate resin, and a resultant was applied with use of a bar coater. With use of an ultraviolet ray curing device (manufactured by EYE GRAPHICS Co., Ltd., ECS-4011GX, high-pressure mercury lamp), the uncured resin was cured under a condition with an integrated light intensity of 500 mJ/cm$^2$, thereby producing a protection layer (thickness: 2.0 μm) (protection layer forming step).

Example 15

A decorative film formed body was produced by a method similar to that of Example 8 except that the following steps were adopted as the release layer forming step, the vapor deposition layer forming step, and the adhesive layer forming step. In the release layer forming step, with a polyethylene terephthalate (PET) film (matte film, thickness: 25 μm) as a separation base material, acrylic polyol resin (additive amount: 82.6 parts) and a curing agent (isocyanate, additive amount: 17.3 parts) were applied with use of a bar coater, and this uncured resin layer was cured at 150° C. with a duration of 30 seconds, thereby producing the protection layer (thickness: 1.8 μm) (protection layer forming step). Vacuum vapor deposition of aluminum was performed on the protection layer with use of a resistance heating vapor deposition machine. An aluminum film (vapor deposition layer) having a thickness of 50 nm was formed (vapor deposition layer forming step). A vinyl chloride acetate resin solution was applied on the vapor deposition layer with use of a bar coater, thereby producing an adhesive layer (thickness: 1.0 μm) (adhesive layer forming step).

Example 16

A decorative film formed body was produced by a method similar to that of Example 15 except that the following steps were adopted as the protection layer forming step. In the protection layer forming step, an acrylic polyol solution (additive amount: 82.6 parts) and a curing agent (isocyanate, additive amount: 17.3 parts) were applied with use of a bar coater, and this uncured resin layer was cured at 150° C. with a duration of 30 seconds, thereby producing the protection layer (thickness: 0.5 μm) (protection layer forming step).

Comparative Example 1

A decorative film formed body was produced by a method similar to that of Example 8 except that the following steps were adopted as the release layer forming step, the vapor deposition layer forming step, and the adhesive layer forming step. In the release layer forming step, a polyethylene terephthalate (PET) film (thickness: 25 μm) was used as a separation base material. An acrylic melamine resin solution (additive amount: 93 parts) and a curing agent (p-toluenesulfonic acid, additive amount: 7 parts) having no filler incorporated therein were applied with use of a bar coater. This uncured resin layer was cured at 150° C. with a duration of 60 seconds, thereby producing a release layer (thickness: 1.0 μm) (release layer forming step). A polyfunctional acrylate resin solution was applied on the release layer with use of a bar coater, and this uncured resin was cured with use of an ultraviolet ray curing device (manufactured by EYE GRAPHICS Co., Ltd., ECS-4011GX, high-pressure mercury lamp). In the vapor deposition layer forming step, vacuum vapor deposition of chromium was performed with use of a resistance heating vapor deposition machine. A chromium film (vapor deposition layer) having a thickness of 50 nm was formed (vapor deposition layer forming step). A vinyl chloride acetate resin solution was applied on the vapor deposition layer with use of a bar coater, thereby producing an adhesive layer (thickness: 1.0 μm) (adhesive layer forming step).

Comparative Example 2

A decorative film formed body was produced by a method similar to that of Example 15 except that the following step was adopted as the release layer forming step. In the release layer forming step, a polyethylene terephthalate (PET) film (thickness: 25 μm) was used as a separation base material. True spherical fillers (acryl, Art Pearl J4PY, manufactured by Negami Chemical Industrial Co., Ltd, dimension: average particle diameter 2.2 μm, additive amount: 10 parts) were incorporated into an acrylic melamine resin solution (additive amount: 93 parts) and a curing agent (p-toluenesulfonic acid, additive amount: 7 parts), and a resultant was applied with use of a bar coater. This uncured resin layer was cured at 150° C. with a duration of 60 seconds, thereby producing a release layer (thickness: 1.0 μm) (release layer forming step).

Comparative Example 3

A decorative film formed body was produced by a method similar to that of Example 15 except that the following steps were adopted as the release layer forming step and the protection layer forming step. In the release layer forming step, a polyethylene terephthalate (PET) film (thickness: 25 μm) was used as a separation base material. True spherical fillers (acryl, Art Pearl J4PY, manufactured by Negami Chemical Industrial Co., Ltd, dimension: average particle diameter 2.2 μm, additive amount: 10 parts) were incorporated into acrylic melamine resin (additive amount: 93 parts) and a curing agent (p-toluenesulfonic acid, additive amount: 7 parts), and a resultant was applied with use of a bar coater. This uncured resin layer was cured at 150° C. with a duration of 60 seconds, thereby producing a release layer (thickness: 1.0 μm) (release layer forming step). In the protection layer forming step, scale-shaped fillers (Talc, FG-15, Nippon Talc Co., Ltd., average particle diameter: 1.5 μm, additive amount: 15 parts) were incorporated into acrylic polyol solution (additive amount: 82.6 parts) were incorporated into a curing agent (isocyanate, additive amount: 17.3 parts), and a resultant was applied with use of a bar coater. This uncured resin layer was cured at 150° C. with a duration of 30 seconds, thereby producing the protection layer (thickness: 3.5 μm) (protection layer forming step).

Comparative Example 4

A decorative film formed body was produced by a method similar to that of Example 8 except that the following steps were adopted as the release layer forming step and the protection layer forming step. In the release layer forming step, true spherical fillers (acryl, manufactured by SEKISUI PLASTICS CO., LTD., dimension: average particle diameter 2.0 μm, content percentage: 8%) were incorporated into acrylic melamine resin (content percentage: 93%) and a curing agent (p-toluenesulfonic acid, content percentage: 7%), and a resultant was applied with use of a bar coater. This uncured resin layer was cured at 150° C. with a duration of 60 seconds, thereby producing the release layer (thickness: 0.5 μm) (release layer forming step). The fillers were exposed from the surface of the release layer. Lens-shaped fillers (acryl, manufactured by SEKISUI PLASTICS CO., LTD., dimension: major diameter 7.2 μm, thickness 2.8 μm, content percentage: 30%) were incorporated into polyfunctional acrylate resin, and a resultant was applied on the release layer with use of a bar coater. With use of an ultraviolet ray curing device (manufactured by EYE GRAPHICS Co., Ltd., ECS-4011GX, high-pressure mercury lamp), the uncured resin was cured under a condition with an integrated light intensity of 500 mJ/cm$^2$, thereby producing a protection layer (thickness: 2.5 μm) (protection layer forming step).

REFERENCE

As a reference, a formed body having been subjected to general satin plating (distinctness of image (DOI)=18.1, GS60°/L*45=38.0) was prepared.

For the decorative film formed bodies obtained in Examples 1 to 23 and Comparative examples 1 to 6, the distinctness of image and the ratio (GS60°/L*45) were calculated by the following method. Moreover, for each of the decorative film formed bodies, evaluation was made by the following methods in terms of visual check (metallic presentation), visual check (reflection), and comprehensive evaluation (difference with respect to satin plating). Moreover, a maximum diameter (μm) of each of the recessed portions or the projecting portions of the vapor deposition layer and a maximum diameter (μm) of each of the recessed portions of the protection layer were measured. Results are shown in Table 1.

<Calculation Method for Distinctness of Image>

The distinctness of image was calculated by measuring a distinctness of image (DOI) of the surface of the formed body with use of Appearance Analyzer (Rhopoint IQ-S, manufactured by Rhopont Instruments) in accordance with ASTM-D5767.

<Calculation Method for Ratio (GS60°/L*45)>

A specular glossiness given when an incident angle is 60° (GS60°) was measured, with use of an appearance analyzer (Rhopoint IQ-S, manufactured by Rhopoint), irradiating the surface of the formed body with light at an incident angle of 60° and receiving specular reflection light, thereby measuring the specular glossiness (GS60°). An L* value given when an incident angle and an acceptance angle are 45° (L*45) was measured, with use of a multi-angle spectrophotometer (MA-T6, manufactured by X-Rite Inc.), by measuring color of the surface of the formed body and calculating an L value given when an incident angle and an acceptance angle are 45°. The ratio (GS60°/L*45) was calculated by dividing the obtained value of the specular glossiness (GS60°) by the value of L*45.

The maximum diameter of each of the projecting portions or the maximum diameter of each of the recessed portions was obtained by observing a surface of the decorative film formed body from a perpendicular direction with use of an electron microscope or an optical microscope, randomly sampling twenty projecting portions or recessed portions, measuring maximum diameters of contours of the projecting portions or the recessed portions, and calculating an average value of twenty samples.

<Metallic Presentation (Visual Check)>

The metallic presentation (visual check) was observed by visually checking each of the decorative film formed bodies, and the degree of the metallic presentation was evaluated in 6 levels including levels 1 to 6. The level 6 exhibits the highest degree of metallic presentation.

<Metallic Presentation (Reflection)>

The metallic presentation (reflection) was observed by visually checking each of the decorative film formed bodies, and the degree of reflection was evaluated in 5 levels including levels 1 to 5. The level 5 exhibits minimum reflection.

<Comprehensive Evaluation (Difference with Respect to Satin Plating)>

The comprehensive evaluation (difference with respect to satin plating) was carried out by visually checking each of the decorative film formed bodies, and a degree of similarity to the satin plating was evaluated in 7 levels including levels 1 to 7. The level 7 is closest to the satin plating.

L3 major diameter of lens-shaped filler
L4 thickness of lens-shaped filler
L5 major diameter of scale-shaped filler
L6 thickness of scale-shaped filler
L7 major diameter of scale-shaped filler
L8 thickness of scale-shaped filler

TABLE 1

|  | Distinctness of image | Ratio (GS60°/L*45) | Metallic presentation (visual check) | Metallic presentation (reflection) | Comprehensive evaluation (difference with respect to satin plating) | Recess/projection maximum diameter/μm vapor deposition layer | Recess maximum diameter/μm protection layer |
|---|---|---|---|---|---|---|---|
| Example 1 | 24.5 | 7.9 | 2 | 4 | 5 | 4.1 | 12.1 |
| Example 2 | 35 | 15 | 3 | 3 | 6 | 2.5 | 2.9 |
| Example 3 | 41.1 | 11.11 | 2 | 3 | 5 | 3.9 | 3.1 |
| Example 4 | 45 | 19.3 | 3 | 3 | 6 | 3.2 | 9.1 |
| Example 5 | 70.2 | 16.9 | 3 | 2 | 4 | 9.5 | — |
| Example 6 | 71.1 | 5.1 | 2 | 2 | 4 | 9.1 | — |
| Example 7 | 72 | 54.7 | 5 | 2 | 4 | 4.0 | — |
| Example 8 | 11.96 | 6.36 | 2 | 5 | 5 | 11.8 | 13.2 |
| Example 9 | 31.6 | 7.11 | 2 | 4 | 4 | 11.2 | 6.9 |
| Example 10 | 17 | 15.3 | 3 | 5 | 6 | 18.1 | — |
| Example 11 | 46 | 47.2 | 5 | 3 | 6 | 10.9 | — |
| Example 12 | 90.2 | 54.3 | 5 | 2 | 4 | 2.8 | — |
| Example 13 | 89.5 | 15.2 | 3 | 2 | 4 | 3.0 | — |
| Example 14 | 91.1 | 4.2 | 2 | 2 | 4 | 3.4 | — |
| Example 15 | 22 | 33.1 | 4 | 4 | 7 | 6.9 | 11.7 |
| Example 16 | 31 | 51.7 | 5 | 3 | 7 | 4.2 | 14.5 |
| Comparative example 1 | 98 | 430 | 6 | 1 | 1 | — | — |
| Comparative example 2 | 45 | 4.7 | 1 | 3 | 3 | — | 2.5 |
| Comparative example 3 | 21 | 3.9 | 1 | 4 | 3 | 1.7 | 2.3 |
| Comparative example 4 | 1.9 | 2.4 | 1 | 5 | 2 | 12.9 | 1.9 |
| Reference | 18.1 | 38 | 2 | 4 | — | — | — |

As shown in Table 1, each of the decorative film formed bodies of Examples 1 to 16 had appropriate distinctness of image and ratio (GS60°/L*45), and metallic design presentation similar to satin plating could be exhibited. Meanwhile, the decorative film formed bodies of Comparative examples 1 to 4 which did not satisfy any of the distinctness of image and the ratio (GS60°/L*45) could not obtain the metallic design presentation similar to the satin plating.

REFERENCE SIGNS LIST

1, 1a, 1b, 1c decorative film formed body
2 separation base material
3 release layer
4 protection layer
5 vapor deposition layer
5a vapor deposition anchor layer
6 adhesive layer
7 transfer base material
81, 82 recesses and projections
91, 92 lens-shaped fillers
91a, 92a scale-shaped fillers
L1 major diameter of lens-shaped filler
L2 thickness of lens-shaped filler

What is claimed is:

1. A decorative film formed body, comprising:
   a base material;
   an adhesive layer;
   a vapor deposition layer; and
   a protection layer,
   wherein the vapor deposition layer has recesses and projections formed on a surface thereof,
   wherein the adhesive layer includes scale-shaped fillers, and
   wherein the protection layer has recesses and projections formed on a surface thereof on a side opposite to a surface on which the vapor deposition layer is provided.

2. The decorative film formed body according to claim 1, wherein the recesses and projections include projecting portions projecting toward the protection layer side.

3. The decorative film formed body according to claim 1, wherein the scale-shaped fillers are embedded in the adhesive layer, and the recesses and projections of the vapor deposition layer comprise recesses and projections deformed along a shape of the embedded scale-shaped fillers.

4. A satin-plated preparation using the decorative film formed body of claim 1.

* * * * *